(12) United States Patent
Cheng et al.

(10) Patent No.: US 11,527,534 B2
(45) Date of Patent: Dec. 13, 2022

(54) GAP-INSULATED SEMICONDUCTOR DEVICE

(71) Applicant: Taiwan Semiconductor Manufacturing Company, Ltd., Hsinchu (TW)

(72) Inventors: Jung-Chien Cheng, Hsinchu (TW); Shi Ning Ju, Hsinchu (TW); Guan-Lin Chen, Hsinchu County (TW); Kuo-Cheng Chiang, Hsinchu County (TW); Chih-Hao Wang, Hsinchu County (TW); Kuan-Lun Cheng, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 75 days.

(21) Appl. No.: 17/142,640

(22) Filed: Jan. 6, 2021

(65) Prior Publication Data

US 2022/0216203 A1   Jul. 7, 2022

(51) Int. Cl.
*H01L 27/092* (2006.01)
*H01L 29/06* (2006.01)
*H01L 29/423* (2006.01)
*H01L 29/66* (2006.01)
*H01L 29/786* (2006.01)
*H01L 21/8238* (2006.01)

(52) U.S. Cl.
CPC .... *H01L 27/092* (2013.01); *H01L 21/823807* (2013.01); *H01L 21/823814* (2013.01); *H01L 21/823878* (2013.01); *H01L 29/0665* (2013.01); *H01L 29/42392* (2013.01); *H01L 29/66742* (2013.01); *H01L 29/78621* (2013.01); *H01L 29/78696* (2013.01)

(58) Field of Classification Search
CPC .......... H01L 27/092; H01L 21/823807; H01L 21/823814; H01L 21/823878; H01L 29/0665; H01L 29/42392; H01L 29/66742; H01L 29/78621; H01L 29/78696
USPC ....................................................... 257/288
See application file for complete search history.

(56) References Cited

U.S. PATENT DOCUMENTS

| | | | |
|---|---|---|---|
| 9,818,872 | B2 | 11/2017 | Ching et al. |
| 9,887,269 | B2 | 2/2018 | Ching et al. |
| 9,899,398 | B1 | 2/2018 | Colinge et al. |
| 10,032,627 | B2 | 7/2018 | Lee et al. |
| 10,109,721 | B2 | 10/2018 | Lin et al. |
| 10,157,799 | B2 | 12/2018 | Ching et al. |

(Continued)

*Primary Examiner* — Tong-Ho Kim
(74) *Attorney, Agent, or Firm* — Haynes and Boone, LLP

(57) ABSTRACT

Semiconductor structures and the manufacturing method thereof are disclosed. An exemplary semiconductor structure according to the present disclosure includes a first base portion and a second base portion, an isolation feature sandwiched between the first base portion and the second base portion, a center dielectric fin over the isolation feature, a first anti-punch-through (APT) feature over the first base portion, a second APT feature over the second base portion, a first stack of channel members over the first APT feature, and a second stack of channel members over the second APT feature. The center dielectric fin is sandwiched between the first stack of channel members and the second stack of channel members as well as between the first APT feature and the second APT feature.

20 Claims, 28 Drawing Sheets

(56) References Cited

U.S. PATENT DOCUMENTS

| | | |
|---|---|---|
| 10,199,502 B2 | 2/2019 | Huang et al. |
| 10,290,546 B2 | 5/2019 | Chiang et al. |
| 10,475,902 B2 | 11/2019 | Lee et al. |
| 2018/0175036 A1 | 6/2018 | Ching et al. |
| 2020/0381545 A1* | 12/2020 | Chiang ................. H01L 29/785 |
| 2021/0066506 A1* | 3/2021 | Liaw ................. H01L 29/66537 |
| 2021/0091179 A1* | 3/2021 | Wang .................. H01L 29/0847 |
| 2021/0376071 A1* | 12/2021 | Liu ..................... H01L 29/1079 |

* cited by examiner

GAP-INSULATED SEMICONDUCTOR DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

A channel of an MBC transistor includes a plurality of channel members that are formed from a fin-shaped structure rising from a substrate. Because the fin-shaped structure has a base portion that is connected with the substrate, the base portion may provide paths for leakage. While existing MBC transistor structures are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
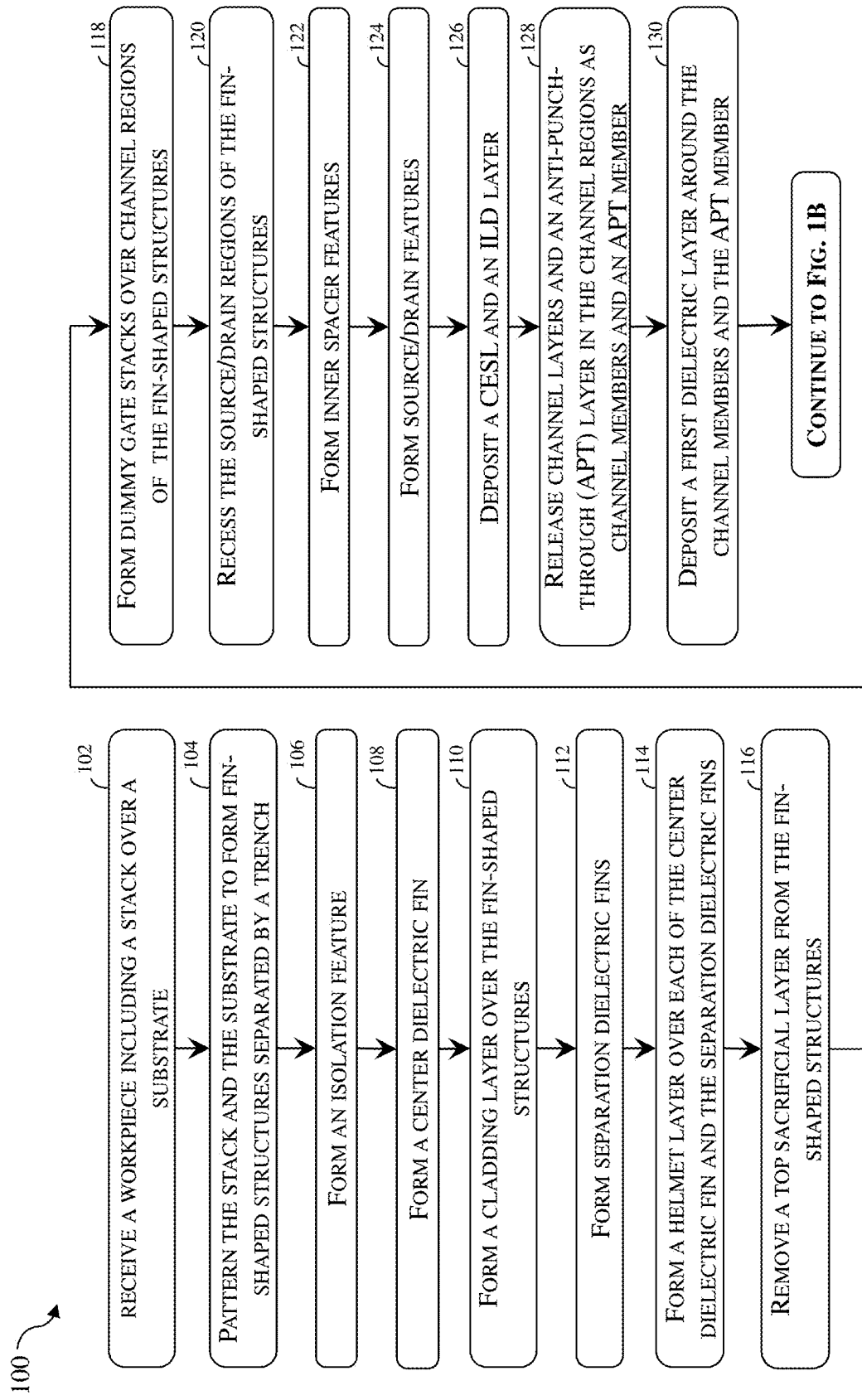
FIGS. 1A and 1B collectively illustrate a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to isolation structures to reduce bulk leakage, and more particularly to a gap-containing structure to isolate active regions from the bulk substrate.

To improve drive current to meet design needs, MBC transistors may include nanoscale channel members that are thin and wide. Such MBC transistors may also be referred to as nanosheet transistors. While nanosheet transistors are able to provide satisfactory drive current and channel control, their wider nanosheet channel members may make it challenging to reduce cell sizes. In some example structures, fish-bone structures or fork-sheet structures may be implemented to reduce cell dimensions. In a fish-bone structure or a fork-sheet structure, adjacent stacks of channel members may be divided by dielectric fins (or hybrid fins). Regardless of the fish-bone or fork-sheet structures, close proximity between the channel members and the base portion may lead to leakage through the bulk substrate.

The present disclosure provides an isolation structure to vertically isolate the channel members from the bulk substrate to reduce bulk leakage. A semiconductor structure according to the present disclosure includes a first base portion and a second base portion arising from a substrate. An isolation feature is sandwiched between the first base portion and the second base portion. A center dielectric fin is disposed over the isolation feature. A first anti-punch-through (APT) feature over the first base portion and a second APT feature over the second base portion. A first stack of channel members is disposed over the first APT feature and a second stack of channel members is disposed over the second APT feature. The center dielectric fin is disposed between the first APT feature and the second APT feature as well as between the first stack of channel members and the second stack of channel members. A first cavity is disposed between the first base portion and the first APT feature. A second cavity is disposed between the second base portion and the second APT feature. The first cavity, the first APT feature, the second cavity, and the second APT feature isolate the channel members from the base portions to reduce or eliminate bulk leakage.

Figure 1B:
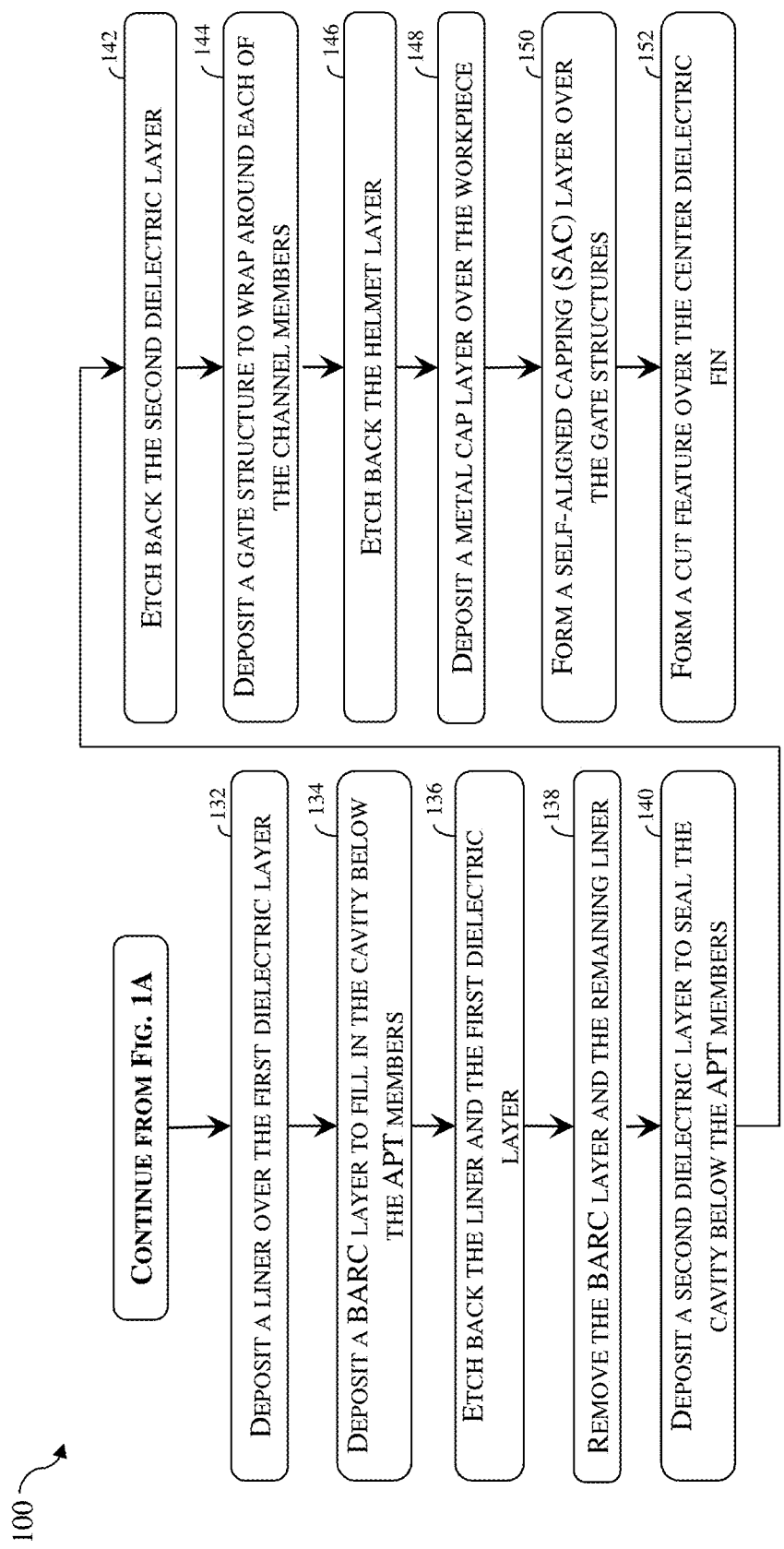

The various aspects of the present disclosure will now be described in more detail with reference to the figures. FIGS. 1A and 1B collectively illustrate a flowchart of a method 100 of forming a semiconductor device. Method 100 is merely an example and is not intended to limit the present disclosure to what is explicitly illustrated in method 100. Additional steps may be provided before, during and after method 100, and some steps described can be replaced, eliminated, or moved around for additional embodiments of the methods. Not all steps are described herein in detail for reasons of simplicity. Method 100 is described below in conjunction with FIGS. 2-27, which illustrate fragmentary cross-sectional views of a workpiece 200 at different stages of fabrication according to embodiments of method 100. Because a semiconductor device will be formed from the workpiece 200, the workpiece 200 may be referred to as a semiconductor device 200 as the context requires. Although embodiments that include fish-bone or fork-sheet transistors are illustrated in the figures, the present disclosure is not so limited and may be applicable to other multi-gate devices, such as MBC transistors or FinFETs. Throughout FIGS. 2-27, the X direction, the Y direction, and the Z direction are perpendicular to one another and are used consistently. Additionally, throughout the present disclosure, like reference numerals are used to denote like features.

Figure 2:
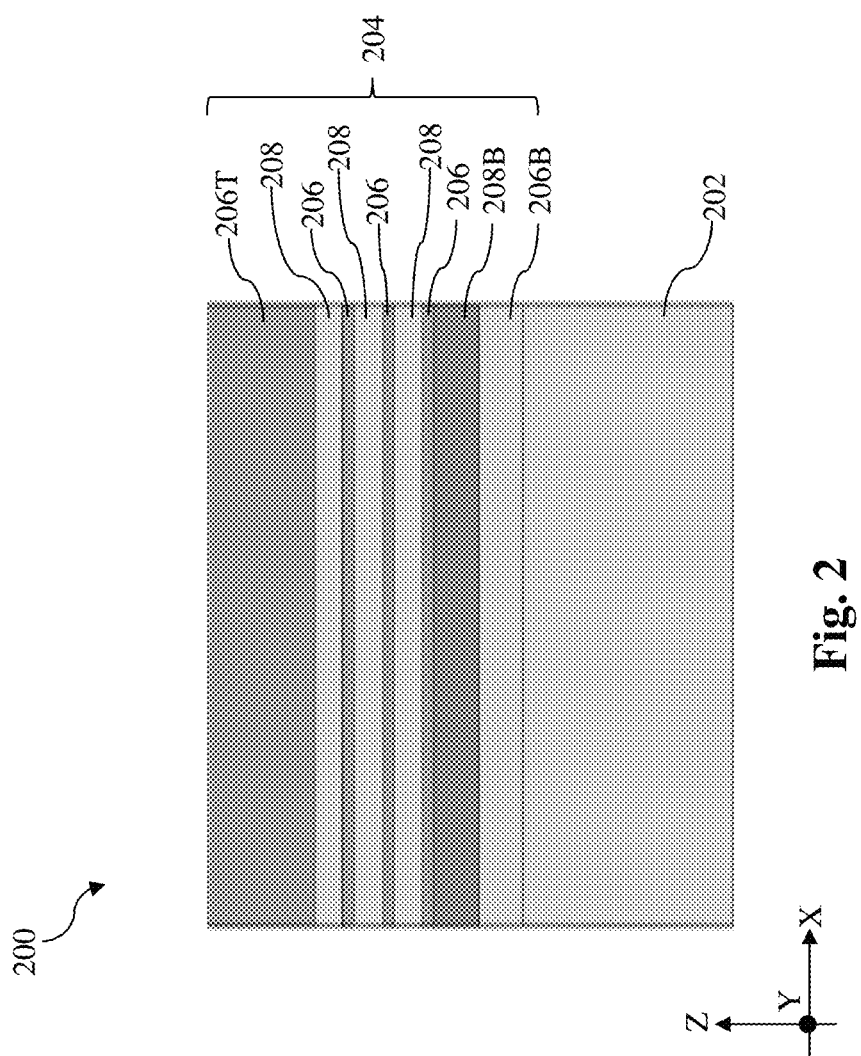
FIGS. 2-27 illustrate fragmentary perspective views or cross-sectional views of a workpiece during various fabrication stages in the method of FIGS. 1A and 1B, according to one or more aspects of the present disclosure.

Referring to FIGS. 1A and 2, method 100 includes a block 102 where a workpiece 200 is received. As shown in FIG. 2, the workpiece 200 includes a substrate 202 and a stack 204 disposed on the substrate 202. In one embodiment, the substrate 202 may be a silicon (Si) substrate. In some other embodiments, the substrate 202 may include other semiconductor materials such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may include multiple n-type well regions and multiple p-type well regions. A p-type well region may be doped with a p-type dopant (i.e., boron (B)). An n-type well region may be doped with an n-type dopant (i.e., phosphorus (P) or arsenic (As)).

In some embodiments represented in FIG. 2, the stack 204 may include a bottom sacrificial layer 206B over the substrate 202, an anti-punch-through (APT) layer 208B over the bottom sacrificial layer 206B, alternating channel layers 208 and sacrificial layers 206 over the bottom sacrificial layer 206B, and a top sacrificial layer 206T over the sacrificial layers 206 and the channel layers 208. The bottom sacrificial layer 206B, the APT layer 208B, the top sacrificial layer 206T, the sacrificial layers 206 and the channel layers 208 may be deposited using an epitaxial process. Example epitaxial process may include vapor-phase epitaxy (VPE), ultra-high vacuum CVD (UHV-CVD)), molecular beam epitaxy (MBE), and/or other suitable processes. The channel layers 208 and the sacrificial layers 206 may have different semiconductor compositions. In some implementations, the channel layers 208 are formed of silicon (Si) and sacrificial layers 206 are formed of silicon germanium (SiGe). The additional germanium (Ge) content in the sacrificial layers 206 allow selective removal or recess of the sacrificial layers 206 without substantial damages to the channel layers 208. The sacrificial layers 206 and the channel layers 208 are disposed alternatingly such that sacrificial layers 206 interleave the channel layers 208. FIG. 2 illustrates that three (3) layers of the sacrificial layers 206 and three (3) layers of the channel layers 208 are alternately and vertically arranged, which is for illustrative purposes only and not intended to be limiting beyond what is specifically recited in the claims. The number of layers depends on the desired number of channels members 208 for the semiconductor device 200. In some embodiments, the number of the channel layers 208 is between 1 and 6. The bottom sacrificial layer 206B may be formed of silicon germanium (SiGe). Different from the sacrificial layers 206, a germanium content of the bottom sacrificial layer 206B may be smaller than a germanium content of the sacrificial layers 206. In some embodiments, the germanium content of the sacrificial layers 206 may be between about 20% and about 30% and the germanium content of the bottom sacrificial layer 206B may be about 80% to about 90% of the germanium content of the sacrificial layer 206. In some instances, the germanium content of the bottom sacrificial layer 206B may be between about 16% and about 27%. The smaller germanium content of the bottom sacrificial layer 206B allows the sacrificial layers 206 to be selectively removed without substantially damaging the bottom sacrificial layer 206B. The bottom sacrificial layer 206B is thicker than each of the sacrificial layers 206 along the Z direction. As will be described below, removal of the bottom sacrificial layer 206B allows formation of a cavity that is large enough not to be filled up by a first dielectric layer 264 and a liner 266. In some instances, each of the sacrificial layers 206 may have a thickness between about 4 nm and about 15 nm while the bottom sacrificial layer 206B may have a thickness between about 8 and about 30 nm.

The APT layer 208B may include silicon (Si) and may be doped with a dopant having a conductivity type different from the conductivity type of the desired MBC transistor. For example, when a p-type MBC transistor is desired, the APT layer 208B may be doped with an n-type dopant, such as phosphorus (P) or arsenic (As). When an n-type MBC transistor is desired, the APT layer 208B may be doped with a p-type dopant, such as boron (B) or boron difluoride ($BF_2$). The deposition of the APT layer 208B may be followed by an activation step, which may include annealing. After activation, the activation concentration of the dopants in the APT layer 208B may be greater than $1 \times 10^{18}$ atoms/$cm^3$, such as between about $1 \times 10^{18}$ atoms/$cm^3$ and about $5 \times 10^{20}$ atoms/$cm^3$. The APT layer 208B is not intended to be formed into a channel member. In that regard, the counter-doping (having a dopant conductivity type different from the dopant conductivity type in the source/drain feature) in the APT layer 208B functions to disable the APT member 208OB (to be described below) formed from the APT layer 208B. The activation concentration in the APT layer 208B may be detected by energy dispersive X-Ray spectroscopy (EDS). The APT layer 208B may be thicker than each of the channel layers 208 along the Z direction. As will be described below, the greater thickness of the APT layer 208B allows it to withstand etching during recess of source/drain regions of the fin-shaped structures 212. In some extreme cases, the APT layer 208B and the channel layers 208 may have the same thickness if subsequent etching processes are more selective and cause less collateral damages to the APT layer 208B. In some instances, each of the channel layers 208 may have a thickness between about 8 nm and about 20 nm while the APT layer 208B may have a thickness between about 8 and about 30 nm.

Like the sacrificial layers 206, the top sacrificial layer 206T may be formed of silicon germanium (SiGe). In some instances, compositions of the sacrificial layers 206 and the top sacrificial layer 206T are substantially the same. The top sacrificial layer 206T may be thicker than the other sacrificial layers 206 and functions to protect the stack 204 from damages during fabrication processes. In some instances, a thickness of the top sacrificial layer 206T may be between about 20 nm and about 40 nm while a thickness of a sacrificial layer 206 may be between about 4 nm and about 15 nm.

Figure 3:
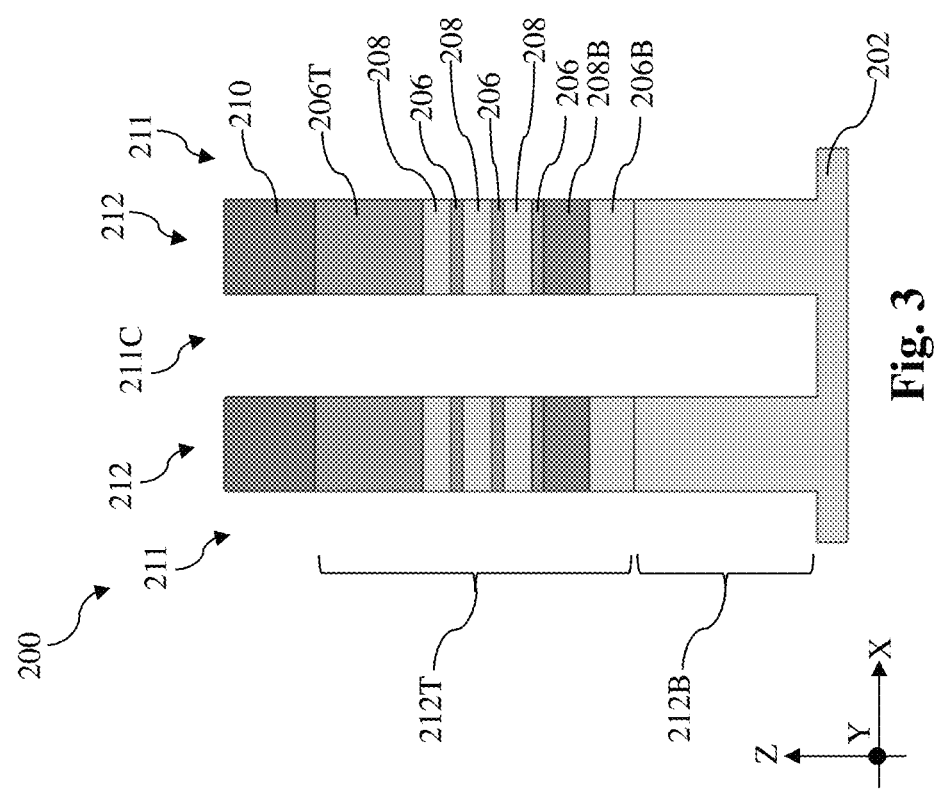

Referring to FIGS. 1A and 3, method 100 includes a block 104 where the stack 204 and the substrate 202 are patterned to form fin-shaped structures 212 separated by a center trench 211C and separation trenches 211. To pattern the stack 204 and the substrate 202, a fin-top hard mask layer 210 is deposited over the top sacrificial layer 206T. The fin-top hard mask layer 210 is then patterned to serve as an etch mask to pattern the stack 204 and a portion of the substrate 202. In some embodiments, the fin-top hard mask layer 210 may be deposited using CVD, plasma-enhanced CVD (PECVD, atomic layer deposition (ALD), plasma-enhanced ALD (PEALD), or a suitable deposition method. The fin-top hard mask layer 210 may be a single layer or a multilayer. When the fin-top hard mask layer 210 is a multi-layer, the fin-top hard mask layer 210 may include a pad oxide and a pad nitride layer. In an alternative embodiment, the fin-top hard mask layer 210 is a single layer and is formed of silicon (Si). The fin-shaped structures 212 may be patterned using suitable processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-top hard mask layer 210 and then the patterned fin-top hard mask layer 210 may be used as an etch mask to etch the stack 204 and the substrate 202 to form fin-shaped structures 212. The etching process can include dry etching, wet etching, reactive ion etching (RIE), and/or other suitable processes.

As shown in FIG. 3, each of the fin-shaped structures 212 includes a base portion 212B formed from a portion of the substrate 202 and a top portion 212T formed from the stack 204. The top portion 212T is disposed over the base portion 212B. The fin-shaped structures 212 extend lengthwise along the Y direction and extend vertically along the Z direction from the substrate 202. Along the X direction, the two fin-shaped structures 212 in FIG. 3 are separated from one another by the center trench 211C while they are separated from other adjacent fin-shaped structures by separation trenches 211. A width of the separation trenches 211 is greater than a width of the center trench 211C along the X direction. In some embodiments, a width of the center trench 211C is between about 10 nm and about 20 nm and a width of the separation trench 211 is between about 20 nm and about 40 nm. In some implementations, the separation trenches 211 are disposed over a junction of an n-type well region and a p-type well region and may therefore be referred to as junction trenches 211. In those implementations, the greater width of the separation trenches 211 functions to separate devices of different conductivity types.

Figure 4:
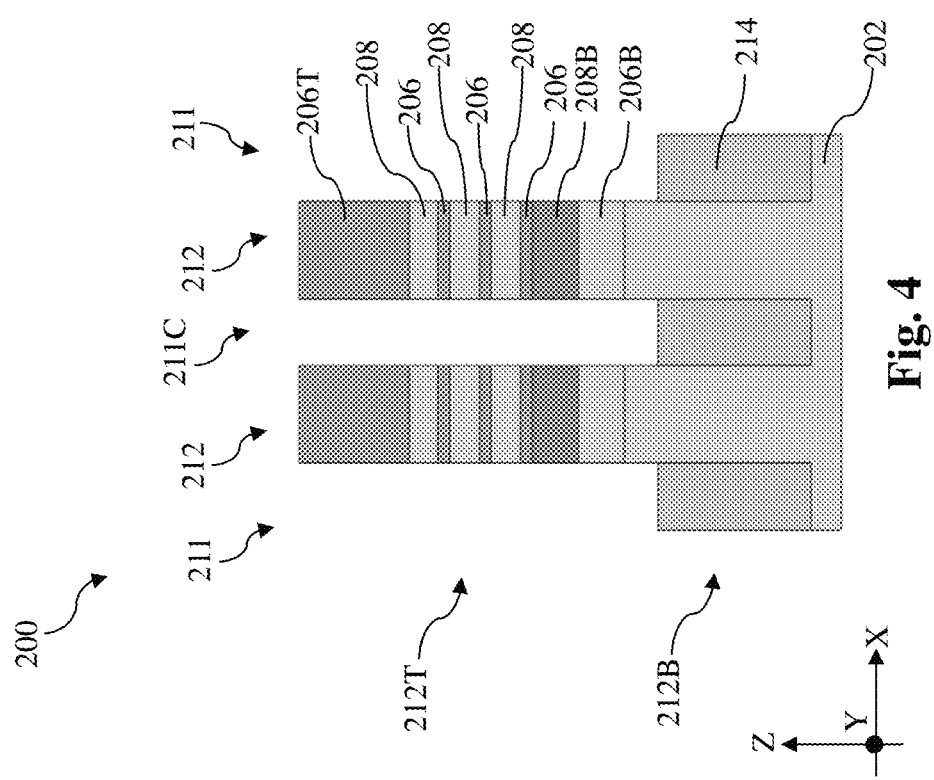

Referring to FIGS. 1A and 4, method 100 includes a block 106 where an isolation feature 214 is formed in the center trench 211C and the separation trenches 211. The isolation feature 214 may be referred to as a shallow trench isolation (STI) feature 214. In an example process to form these isolation feature 214, a dielectric material is deposited over the workpiece 200, filling the center trench 211C and the separation trenches 211 with the dielectric material. In some embodiments, the dielectric material may tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In various examples, at block 106, the dielectric material may be deposited by flowable CVD (FCVD), spin-on coating, and/or other suitable process. The deposited dielectric material is then thinned and planarized, for example by a chemical mechanical polishing (CMP) process, until the top sacrificial layer 206T is exposed. After the planarization, the deposited dielectric material is etched back until the top portions 212T of the fin-shaped structures 212 rises above the isolation feature 214. In some embodiments, a portion of the base portion 212B may also rise above the isolation feature 214. At this point, the base portions 212B, or a substantial portion thereof, is surrounded by the isolation features 214. The isolation feature 214 reduces the depths of the center trench 211C and the separation trenches 211.

Figure 5:
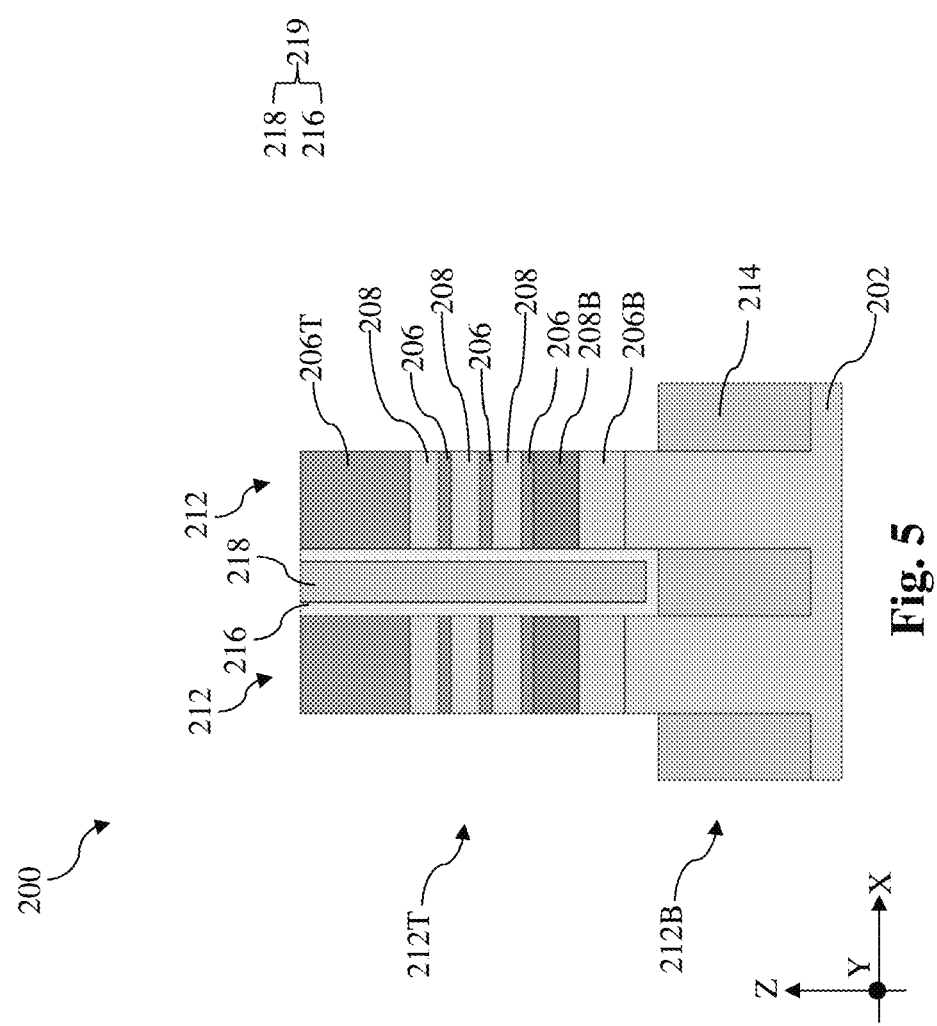

Referring to FIGS. 1A and 5, method 100 includes a block 108 where a center dielectric fin 219 is formed. To form the center dielectric fin 219, a first layer 216 and a second layer 218 are conformally deposited over the workpiece 200, including in the center trench 211C and the separation trenches 211. The first layer 216 may be conformally deposited using CVD, ALD, or a suitable method. The first layer 216 lines the sidewalls and the bottom surfaces of the center trench 211C and the separation trenches 211. The second layer 218 is then conformally deposited over the first layer 216 using CVD, high density plasma CVD (HDPCVD), and/or other suitable process. In some instances, a dielectric constant of the second layer 218 is smaller than that of the first layer 216. The first layer 216 may include silicon nitride, silicon carbide, silicon carbonitride, silicon oxycarbonitride, aluminum nitride, aluminum oxynitride, zirconium nitride, silicon oxynitride, or a suitable dielectric material. In one embodiment, the first layer 216 includes silicon oxycarbonitride. The second layer 218 may include silicon oxide or a suitable dielectric material. In one embodiment, the second layer 218 includes silicon oxide. The conformally deposited first layer 216 and second layer 218 are etched back to expose the top sacrificial layer 206T. Due to the loading effect, the deposited first layer 216 and the second layer 218 in the wider separation trenches 211 are remove by the etch back process while the deposited first layer 216 and the second layer 218 in the narrower center trench 211C remains to become the center dielectric fin 219. In some embodiments, the first layer 216 and the second layer 218 may be etched back in a dry etch process that uses oxygen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some implementations, the etch back may include a first stage that is directed toward the second layer 218 and a second stage that is directed toward the first layer 216. As shown in FIG. 5, upon conclusion of the etch back, the isolation feature 214 is exposed in the separation trenches 211.

Figure 6:
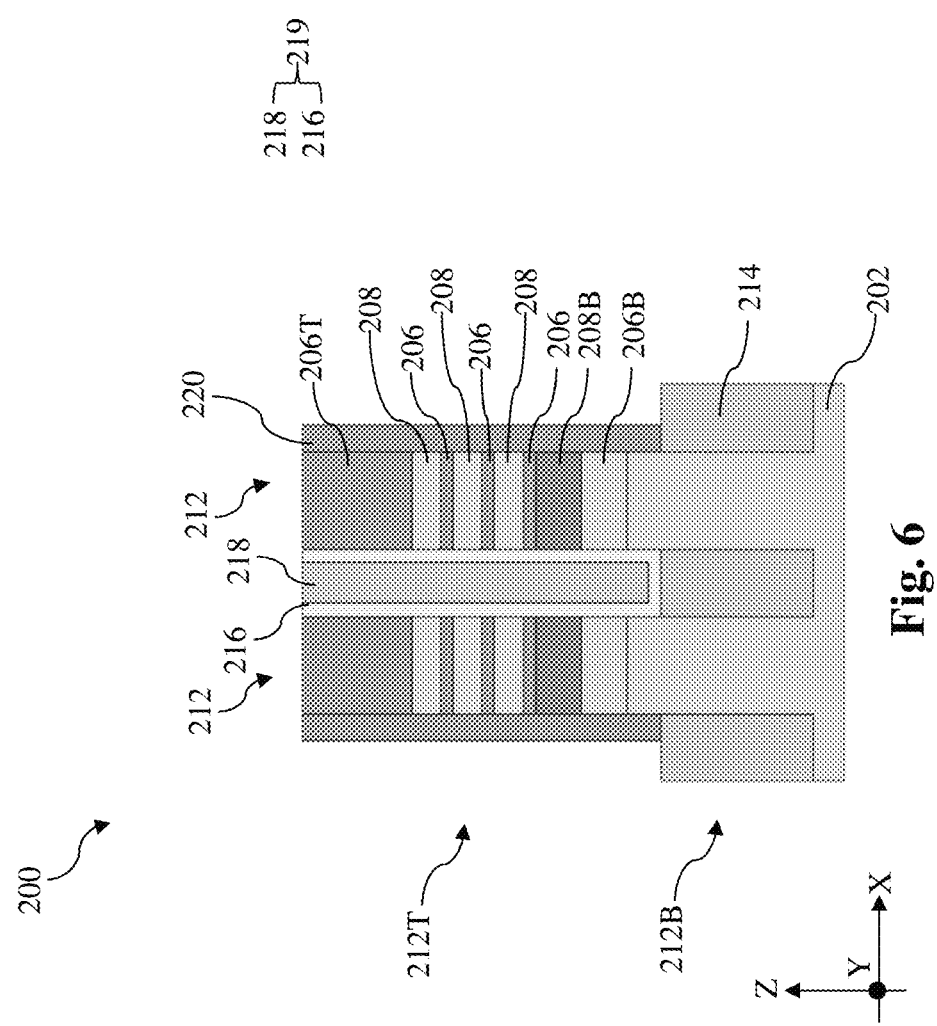

Referring to FIGS. 1A and 6, method 100 includes a block 110 where a cladding layer 220 is formed over the fin-shaped structures 212. With the separation trenches 211 exposed, a cladding layer 220 is deposited over the workpiece 200, including over the sidewalls of the separation trenches 211. In some embodiments, the cladding layer 220 may have a composition similar to that of the sacrificial layers 206 or the top sacrificial layer 206T. In one example, the cladding layer 220 may be formed of silicon germanium (SiGe). Their common composition allows selective and simultaneous removal of the sacrificial layers 206 and the cladding layer 220 in a subsequent process. In some embodiments, the cladding layer 220 may be conformally and epitaxially grown using vapor phase epitaxy (VPE) or molecular beam epitaxy (MBE). As shown in FIG. 6, the cladding layer 220 is selectively disposed on exposed sidewall surfaces in the separation trenches 211, but not on the isolation feature 214 or the center dielectric fin 219. After the deposition of the cladding layer 220, an etch back process is performed to remove the cladding layer 220 over the top sacrificial layer 206T and the center dielectric fin 219.

Figure 7:
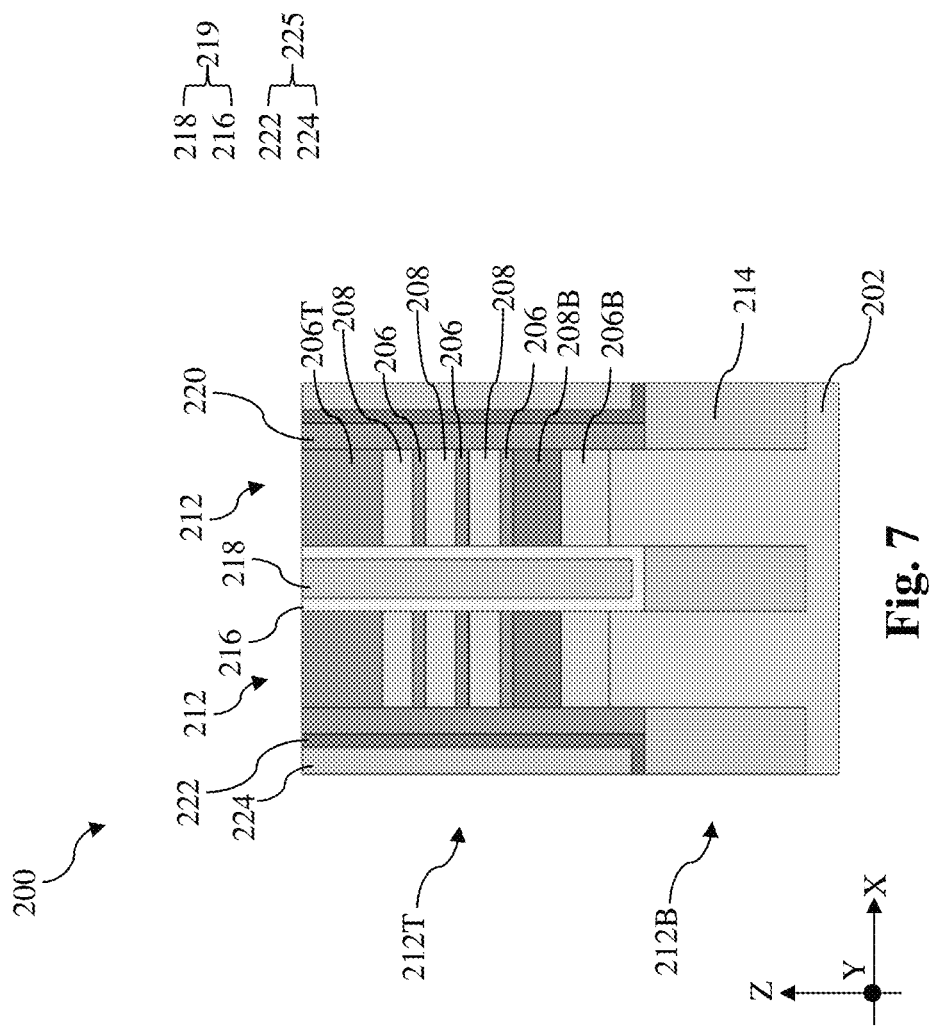

Referring to FIGS. 1A and 7, method 100 includes a block 112 where separation dielectric fins 225 are formed. To form the separation dielectric fins 225, a third layer 222 and a fourth layer 224 are conformally deposited into the separation trenches 211. The composition and the formation of the third layer 222 may be similar to those of the first layer 216. The fourth layer 224 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some instances, the fourth layer 224 may include silicon oxide. In some embodiments, the fourth layer 224 may be deposited by flowable CVD (FCVD), spin-on coating, and/or other suitable process. In one embodiment, the fourth layer 224 may be deposited using FCVD. After the deposition of the third layer 222 and the fourth layer 224, the workpiece 200 is planarized using a chemical mechanical polishing (CMP) process to expose the top sacrificial layer 206T. The planarized third layer 222 and the fourth layer 224 in the separation trenches 211 may be collectively referred to as separation dielectric fins 225.

Figure 8:
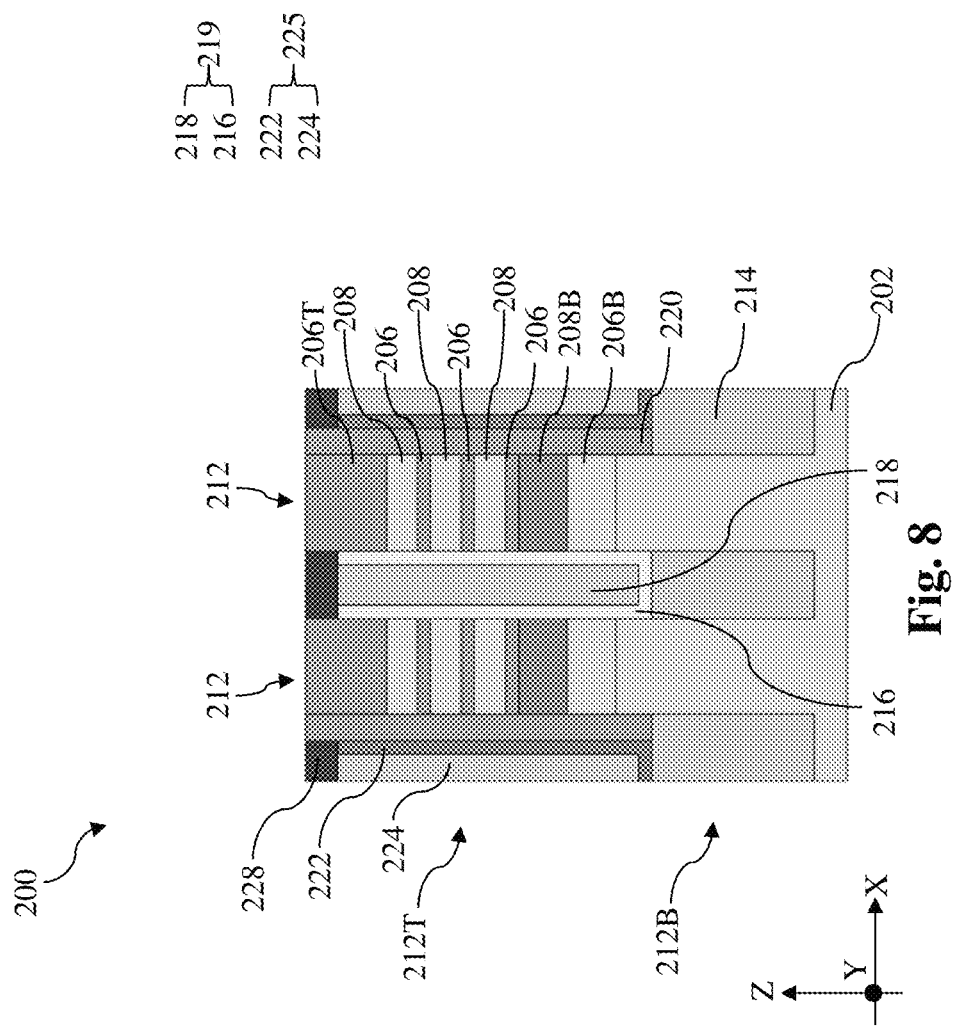

Referring to FIGS. 1A and 8, method 100 includes a block 114 where a helmet layer 228 is formed over each of the center dielectric fin 219 and the separation dielectric fins 225. At block 114, the center dielectric fin 219 and the separation dielectric fins 225 are selectively etched back to form recesses and a helmet layer 228 is deposited in such recesses. In some embodiments, the selective etch back may be performed using a dry etch process that may include oxygen ($O_2$), nitrogen ($N_2$), a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. The helmet layer 228 may include aluminum oxide, zirconium oxide, zirconium aluminum oxide, hafnium oxide, other metal oxide, or a combination thereof. In one embodiment, the helmet layer 228 may include hafnium oxide. In some embodiments, the helmet layer 228 may be deposited using CVD, HDPCVD, or a suitable deposition technique. After the deposition of the helmet layer 228, the workpiece 200 is planarized using a CMP process to remove excess helmet layer 228 on the cladding layer 220 and the top sacrificial layer 206T.

Figure 9:
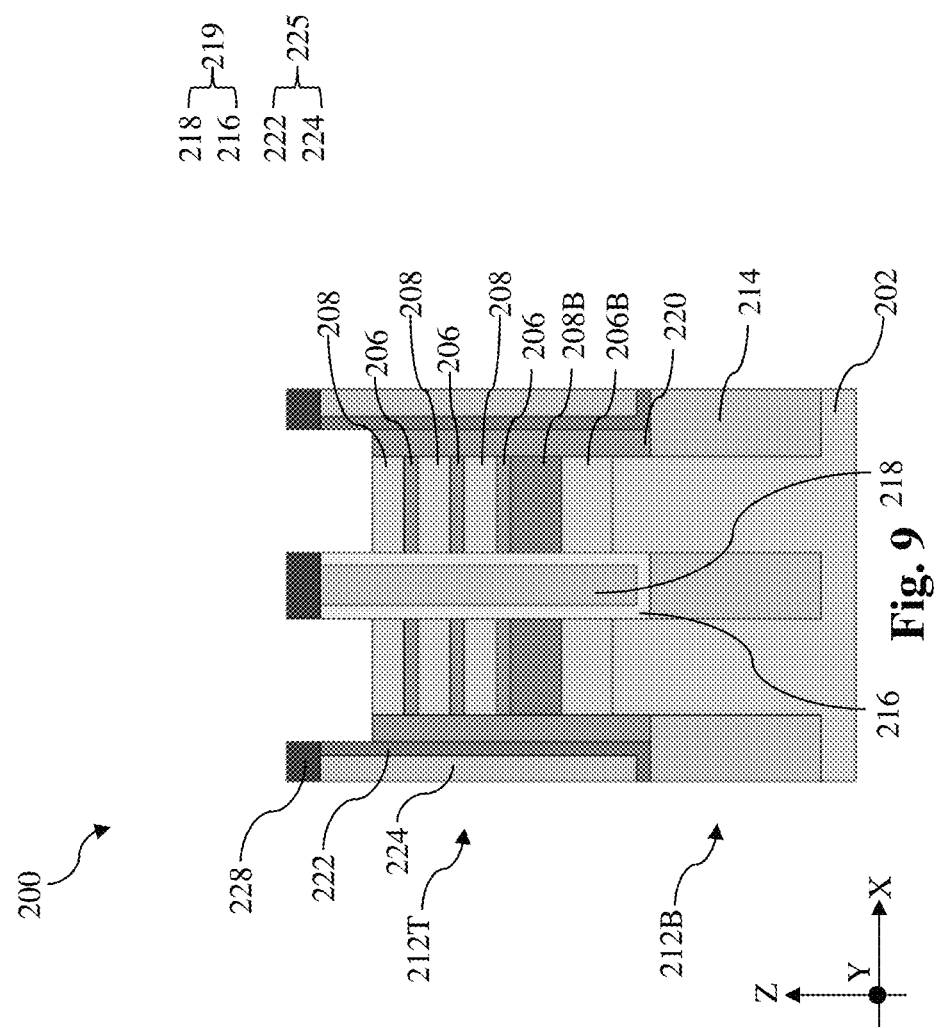

Referring to FIGS. 1A and 9, method 100 includes a block 116 where the top sacrificial layer 206T is removed from the fin-shaped structures 212. At block 116, the workpiece 200 is etched to selectively remove a portion of the cladding layer 220 and the top sacrificial layer 206T to expose the topmost channel layer 208, without substantially damaging the helmet layer 228. Because the top sacrificial layer 206T and the cladding layer 220 are formed of silicon germanium (SiGe), the etch process at block 116 may be selective to silicon germanium (SiGe). In some instances, the cladding layer 220 and the top sacrificial layer 206T may be etched using a selective wet etch process that includes ammonium hydroxide ($NH_4OH$), hydrogen fluoride (HF), hydrogen peroxide ($H_2O_2$), or a combination thereof. As shown in FIG. 9, after the removal of the top sacrificial layer 206T and the etching of the cladding layer 220, the center dielectric fin 219 and the separation dielectric fins 225 rise above the topmost channel layer 208.

Figure 10:
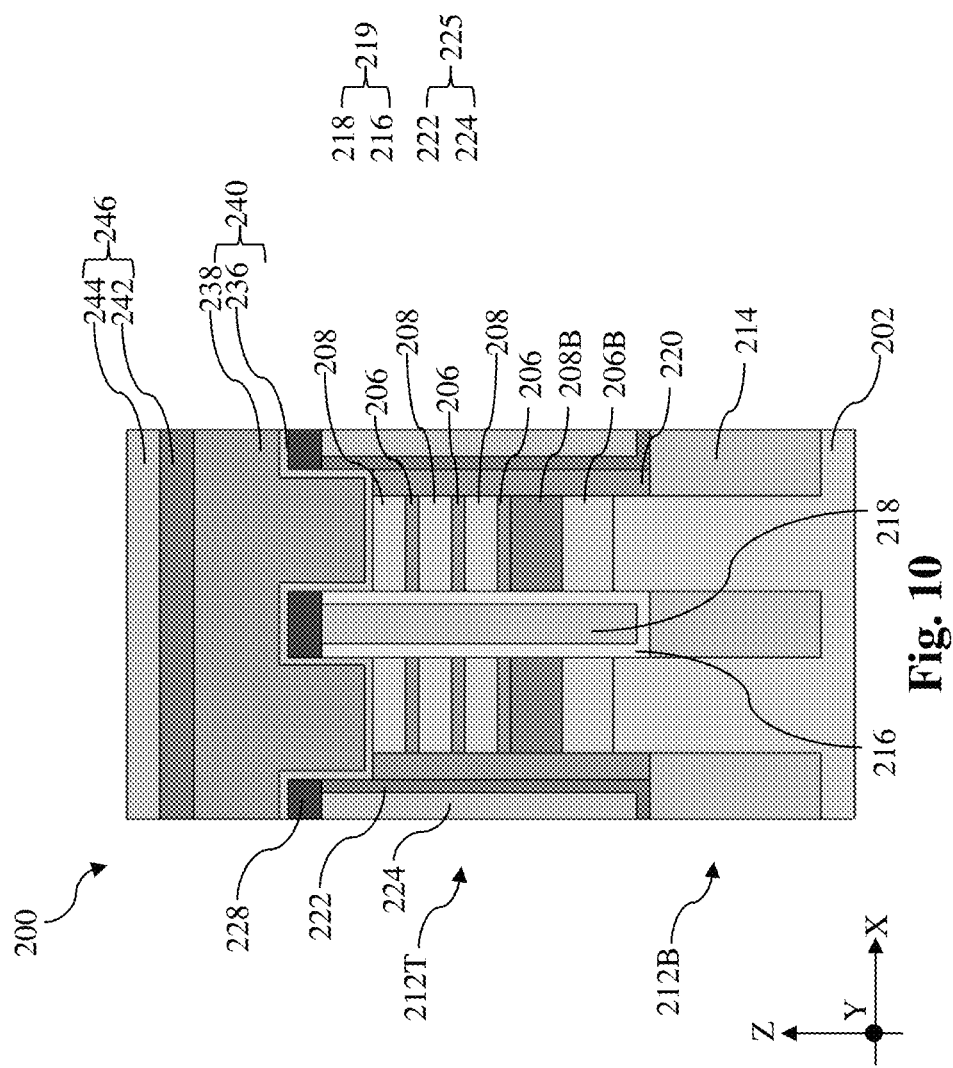
Figure 11:
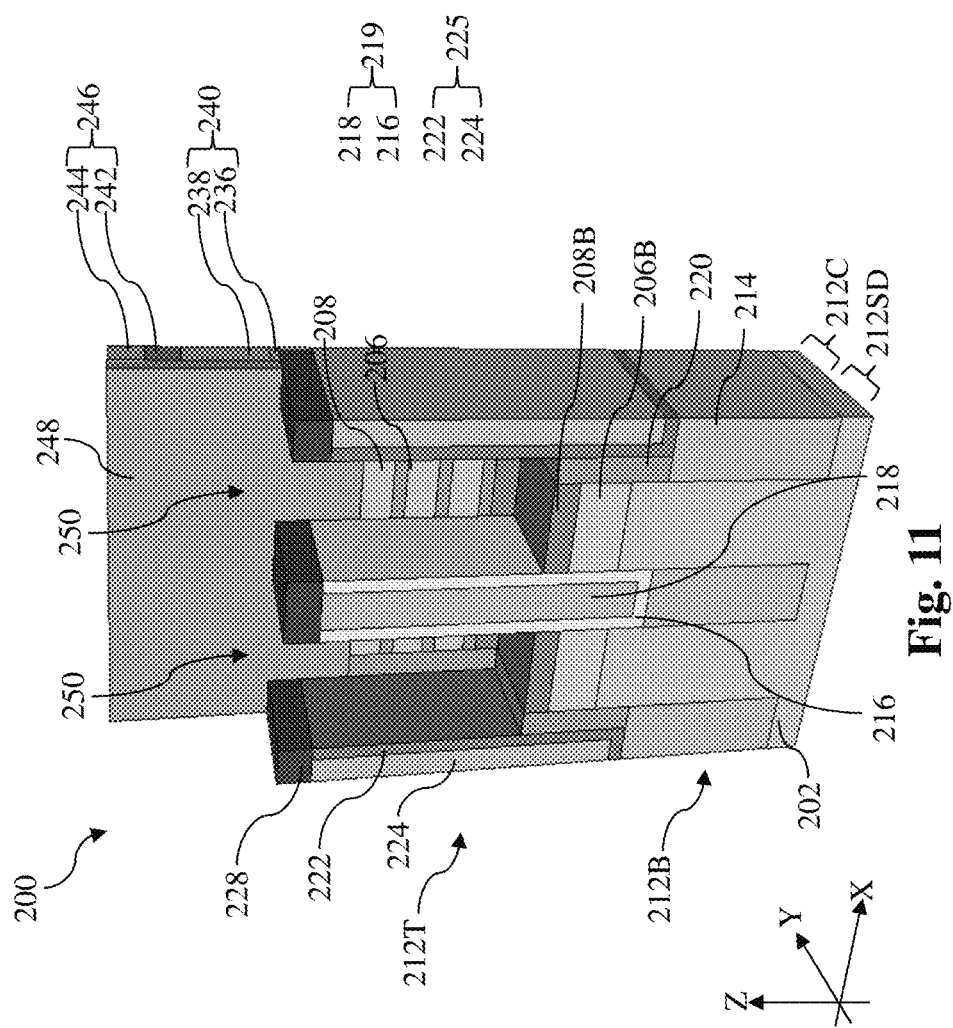

Referring to FIGS. 1A, 10 and 11, method 100 includes a block 118 where a dummy gate stack 240 is formed over the channel regions of the fin-shaped structures 212. In some embodiments, a gate replacement process (or gate-last process) is adopted where the dummy gate stack 240 serves as a placeholder for a functional gate structure. Other processes and configuration are possible. As shown in FIG. 10, the dummy gate stack 240 includes a dummy dielectric layer 236 and a dummy electrode 238 disposed over the dummy dielectric layer 236. For patterning purposes, a gate top hard mask 246 is deposited over the dummy gate stack 240. The gate top hard mask 246 may be a multi-layer and include a silicon nitride mask layer 242 and a silicon oxide mask layer 244 over the silicon nitride mask layer 242. The regions of the fin-shaped structures 212 underlying the dummy gate stack 240 may be referred to as channel regions. Each of the channel regions in a fin-shaped structure 212 is sandwiched between two source/drain regions for source/drain formation. In an example process, the dummy dielectric layer 236 is blanketly deposited over the workpiece 200 by CVD. A semiconductor layer for the dummy electrode 238 is then blanketly deposited over the dummy dielectric layer 236. The dummy dielectric layer 236 and the semiconductor layer for the dummy electrode 238 are then patterned using photolithography processes to form the dummy gate stack 240. In some embodiments, the dummy dielectric layer 236 may include silicon oxide and the dummy electrode 238 may include polycrystalline silicon (polysilicon).

Reference is made to FIG. 11. At block 118, at least one gate spacer 248 is formed along sidewalls of the dummy gate stacks 240. Dielectric materials for the at least one gate spacer 248 may be selected to allow selective removal of the dummy gate stack 240. Suitable dielectric materials may include silicon nitride, silicon oxycarbonitride, silicon carbonitride, silicon oxide, silicon oxycarbide, silicon carbide, silicon oxynitride, and/or combinations thereof. In an example process, the at least one gate spacer 248 may be conformally deposited over the workpiece 200 using CVD, subatmospheric CVD (SACVD), or ALD.

Referring to FIGS. 1A and 11, method 100 includes a block 120 where the source/drain regions of the fin-shaped structures 212 are recessed to form source/drain recesses 250. With the dummy gate stack 240 and the at least one gate spacer 248 serving as an etch mask, the workpiece 200 is anisotropically etched to form the source/drain recesses 250 (or source/drain trenches 250) over the source/drain regions of the fin-shaped structures 212. In some embodiments as illustrated in FIG. 11, operations at block 120 may completely remove the sacrificial layers 206 and channel layers 208 in the source/drain regions. In the depicted embodiments, the recess at block 120 may also remove a top portion of the APT layer 208B, thereby thinning it. The anisotropic etch at block 120 may include a dry etch process. For example, the dry etch process may implement hydrogen ($H_2$), a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In FIG. 11, a lower portion of the APT layer 208B and the bottom sacrificial layer 206B remains unetched and may remain sandwiched between the cladding layer 220 and the center dielectric fin 219. Sidewalls of the channel layers 208, the sacrificial layers 206, and the cladding layer 220 are exposed in the source/drain recesses 250.

Figure 12:
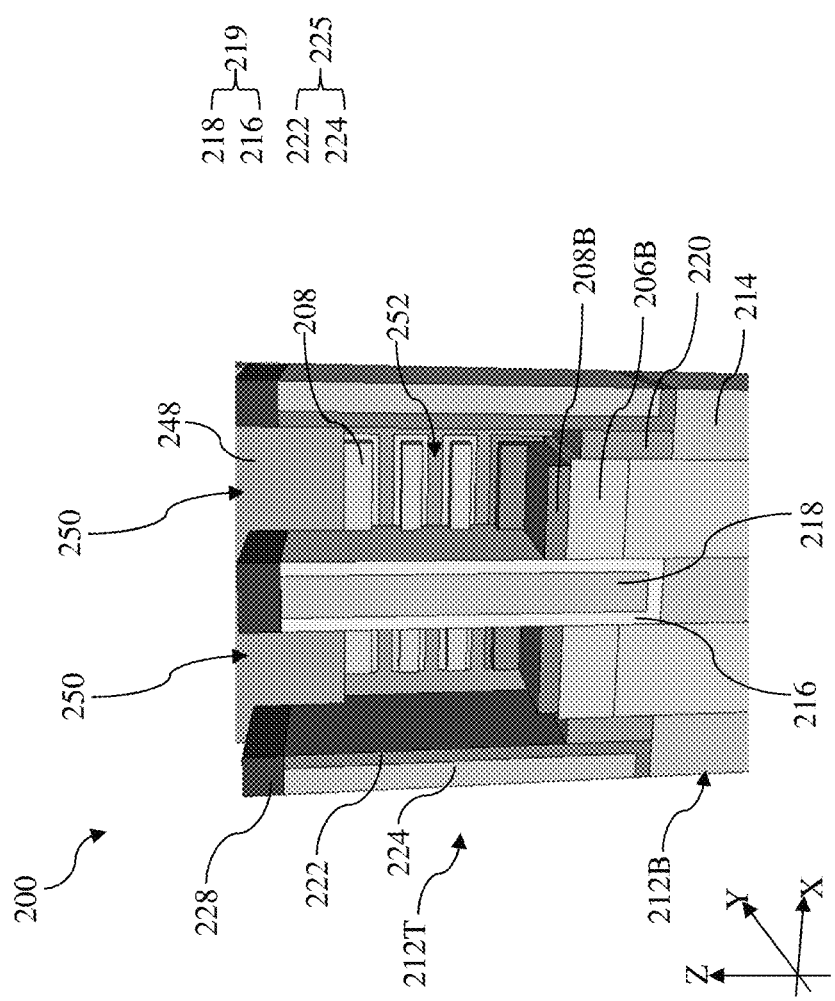
Figure 13:
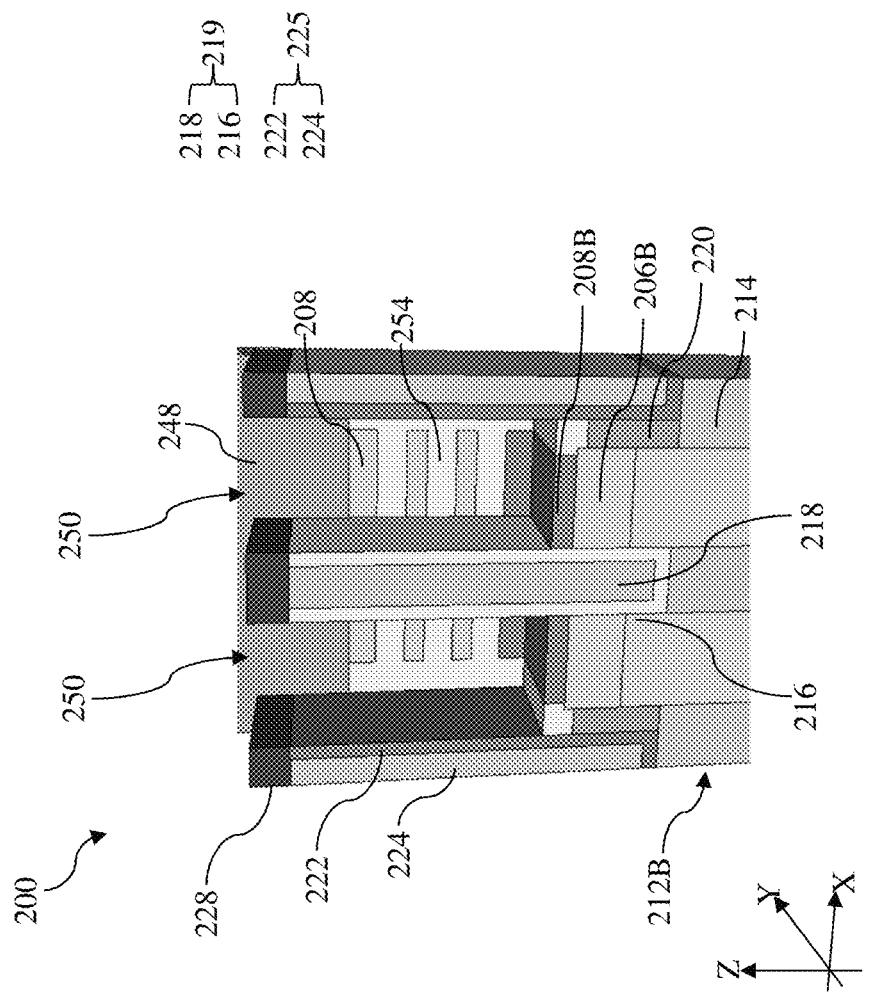

Referring to FIGS. 1A, 12 and 13, method 100 includes a block 122 where inner spacer features 254 are formed. Referring to FIG. 12, at block 122, the sacrificial layers 206 and the cladding layer 220 exposed in the source/drain trenches 250 are first selectively and partially recessed to form inner spacer recesses 252, while the exposed channel layers 208 and the bottom sacrificial layer 206B are substantially unetched. In an embodiment where the channel layers 208 consist essentially of silicon (Si) and sacrificial layers 206 and the cladding layer 220 consist essentially of silicon germanium (SiGe), the selective and partial recess of the sacrificial layers 206 and the cladding layer 220 may include a SiGe oxidation process followed by a SiGe oxide removal. In that embodiments, the SiGe oxidation process may include use of ozone. In some other embodiments, the selective recess may include a selective isotropic etching process (e.g., a selective dry etching process or a selective wet etching process), and the extent at which the sacrificial layers 206 and the cladding layer 220 are recessed is controlled by duration of the etching process. The selective dry etching process may include use of one or more fluorine-based etchants, such as fluorine gas or hydrofluorocarbons. The selective wet etching process may include ammonium hydroxide ($NH_4OH$), hydrogen fluoride (HF), hydrogen peroxide ($H_2O_2$), or a combination thereof (e.g. an APM etch that includes an ammonia hydroxide-hydrogen peroxide-water mixture). As described above, the bottom sacrificial layer 206B includes a lower germanium content than the sacrificial layers 206 (as well as that of the cladding layer 220) and that allows the selective recess of the sacrificial layers 206 and the cladding layer 220. After the formation of the inner spacer recesses 252, an inner spacer material layer is then conformally deposited using CVD or ALD over the workpiece 200, including over and into the inner spacer recesses 252 and the space left behind by the removed portion of the cladding layer 220. The inner spacer material may include silicon nitride, silicon oxycarbonitride, silicon carbonitride, silicon oxide, silicon oxycarbide, silicon carbide, or silicon oxynitride. After the deposition of the inner spacer material layer, the inner spacer material layer is etched back to form inner spacer features 254, as illustrated in FIG. 13.

Figure 14:
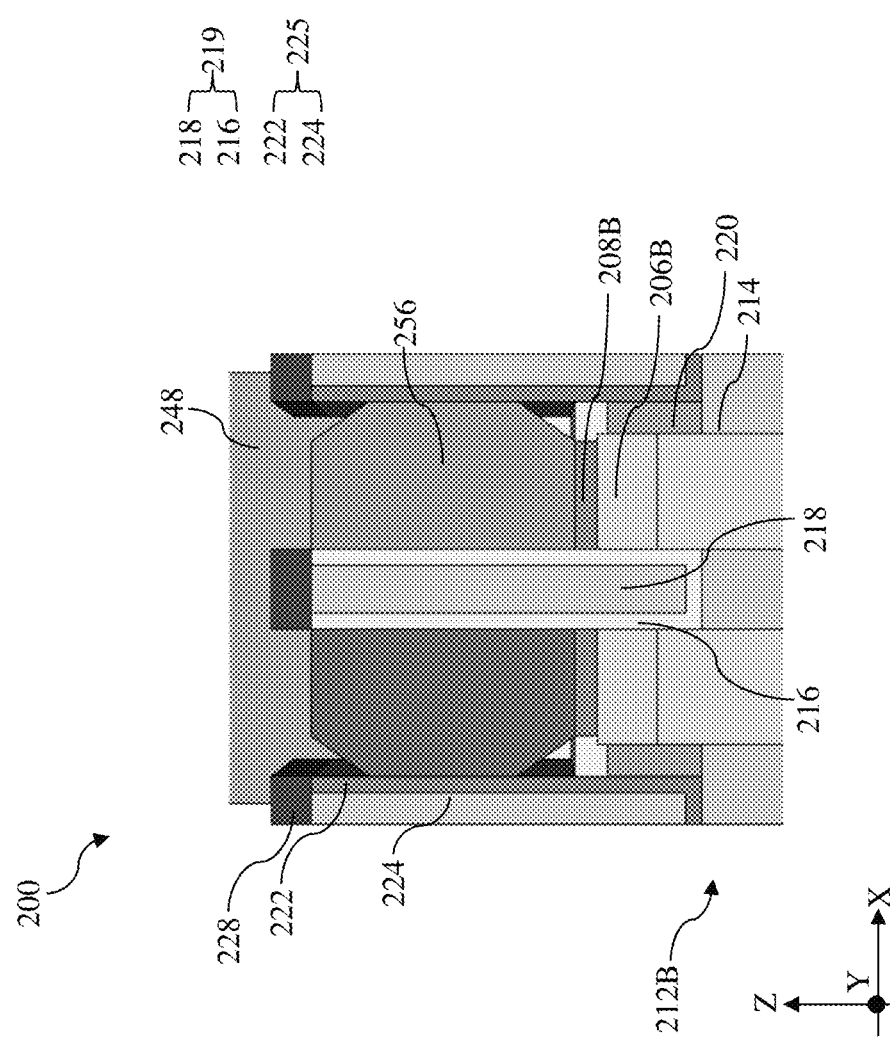

Referring to FIGS. 1A and 14, method 100 includes a block 124 where source/drain features 256 are formed. The source/drain features 256 are selectively and epitaxially deposited on the exposed semiconductor surfaces of the channel layers 208, the APT layer 208B, and the substrate 202 in the source/drain trenches 250. The source/drain features 256 may be deposited using an epitaxial process, such as vapor-phase epitaxy (VPE), ultra-high vacuum CVD (UHV-CVD), molecular beam epitaxy (MBE), and/or other suitable processes. Depending on the design of the semiconductor device 200, the source/drain features 256 may be n-type or p-type. When the source/drain features 256 are n-type, they may include silicon (Si) doped with an n-type dopant, such as phosphorus (P) or arsenic (As). When the source/drain features 256 are p-type, they may include silicon germanium (SiGe) doped with a p-type dopant, such as boron (B) or gallium (Ga). Doping of the source/drain features 256 may be performed either in situ with their deposition or ex situ using an implantation process, such as a junction implant process.

Figure 15:
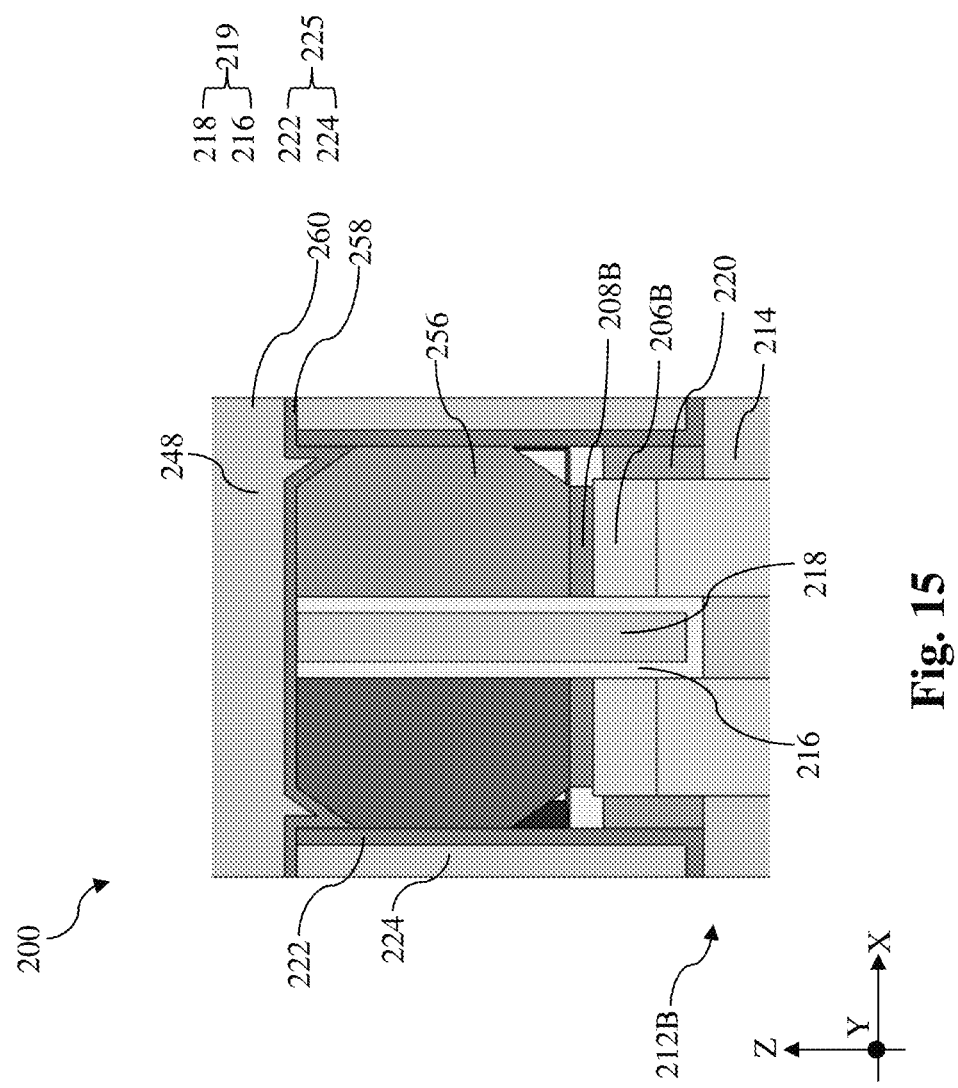

Referring still to FIGS. 1A and 15, method 100 includes a block 126 where a contact etch stop layer (CESL) 258 and an interlayer dielectric (ILD) layer 260 are deposited. In some embodiments, the helmet layer 228 in the source/drain regions are selectively removed before the deposition of the CESL 258. In some instances, the helmet layer 228 may be selectively etched away using buffered hydrofluoric acid (BHF) or diluted hydrofluoric acid (DHF). After the removal of the helmet 228, the CESL 258 is first conformally deposited over the workpiece 200 and then the ILD layer 260 is blanketly deposited over the CESL 258. The CESL 258 may include silicon nitride, silicon oxide, silicon oxynitride, and/or other materials known in the art. The CESL 258 may be deposited using ALD, plasma-enhanced chemical vapor deposition (PECVD) process and/or other suitable deposition or oxidation processes. In some embodiments, the ILD layer 260 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 260 may be deposited by spin-on coating, an FCVD process, or other suitable deposition technique. In some embodiments, after formation of the ILD layer 260, the workpiece 200 may be annealed to improve integrity of the ILD layer 260. To remove excess materials and to expose top surfaces of the dummy electrode 238 of the dummy gate stacks 240, a planarization process (such a chemical mechanical polishing (CMP) process) may be performed to the workpiece 200 to provide a planar top surface. Top surfaces of the dummy electrodes 238 are exposed on the planar top surface.

Figure 16:
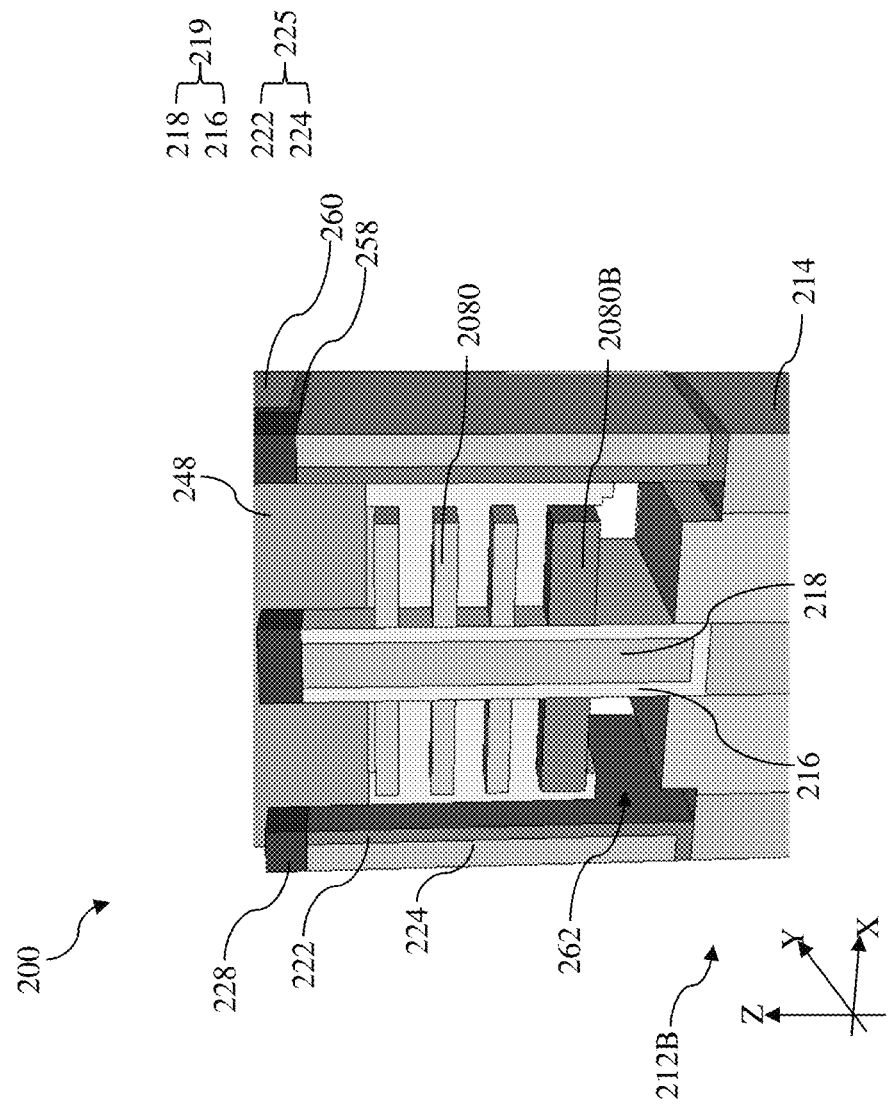

Referring to FIGS. 1A and 16, method 100 includes a block 128 where the channel layers 208 and the APT layer 208B in the channel regions are released as channel members 2080 and an APT member 2080B. Referring to FIG. 16, the dummy gate stack 240 exposed at the conclusion of block 126 is removed from the workpiece 200 by a selective etch process. The selective etch process may be a selective wet etch process, a selective dry etch process, or a combination thereof. In the depicted embodiments, the selective etch process selectively removes the dummy dielectric layer 236 and the dummy electrode 238 without substantially damaging the helmet layer 228 and the at least one gate spacer 248. After the removal of the dummy gate stack 240, channel layers 208, sacrificial layers 206, the APT layer 208B, the bottom sacrificial layer 206B, and the cladding layer 220 in the channel region are exposed. The exposed sacrificial layers 206, the bottom sacrificial layer 206B, and the cladding layer 220 may be selectively removed to release the channel layers 208 as channel members 2080 and release the APT layer 208B as the APT member 2080B. As shown in FIG. 16, when viewed along the Y direction, the channel members 2080 and the APT member 2080B have appearances of cantilever beams stemming from the center dielectric fin 219. In the depicted embodiments where the channel members 2080 resemble a sheet or a nanosheet, the channel member release process may also be referred to as a sheet formation process. After their release, the channel members 2080 and the APT member 2080B are in contact with the center dielectric fin 219 but are spaced apart from the separation dielectric fins 225. The channel members 2080 and the APT member 2080B are vertically stacked along the Z direction. The selective removal of the sacrificial layers 206, the bottom sacrificial layer 206B and the cladding layer 220 may be implemented by selective dry etch, selective wet etch, or other selective etch processes. In some embodiments, the selective wet etching includes ammonium hydroxide ($NH_4OH$), hydrogen fluoride (HF), hydrogen peroxide ($H_2O_2$), or a combination thereof (e.g. an APM etch that includes an ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as $NH_4OH$. In the depicted embodiment, the removal of the bottom sacrificial layer 206B and the cladding layer 220 also forms a cavity 262 below the released APT member 2080B.

Figure 17:
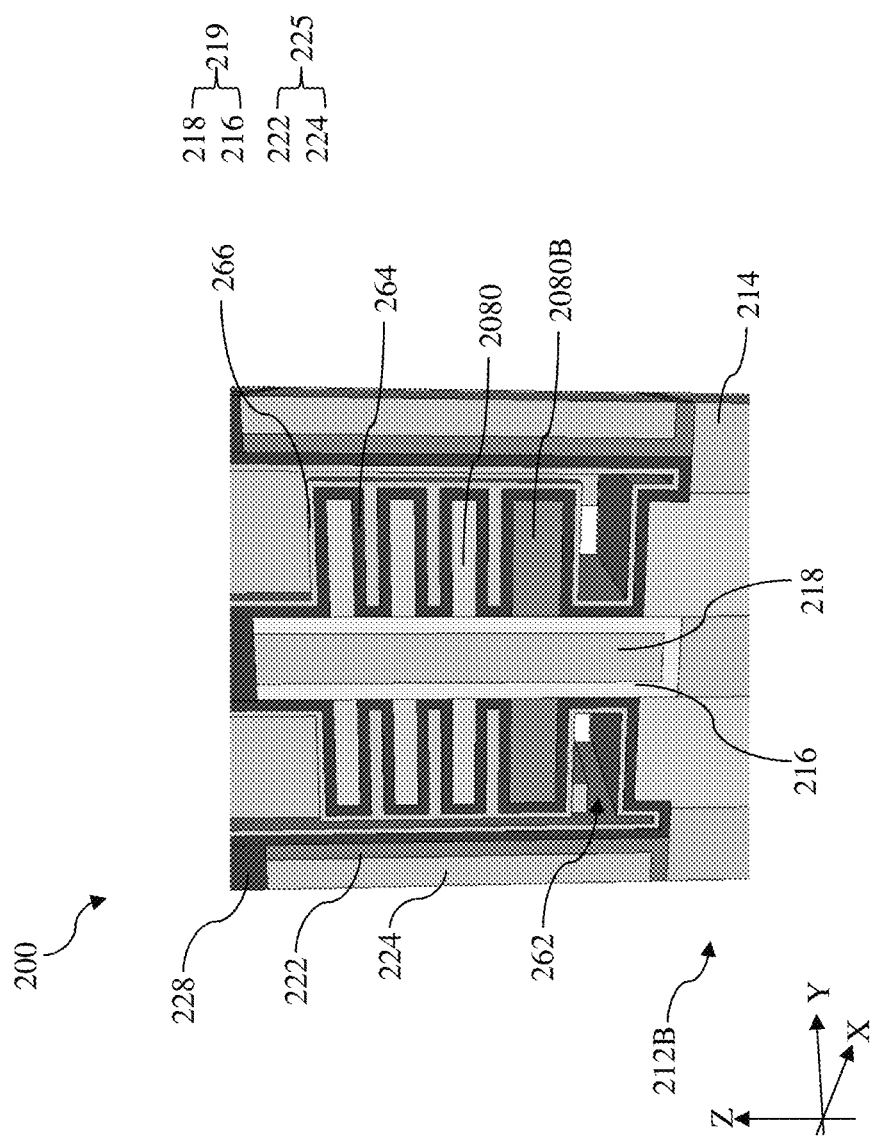

Referring to FIGS. 1A and 17, method 100 includes a block 130 where a first dielectric layer 264 is deposited around the channel members 2080 and the APT member 2080B. In some embodiments, the first dielectric layer 264 is formed of a high-dielectric-constant (i.e., high-k) dielectric material with a dielectric constant greater than that of silicon dioxide, which is about 3.9. In some instances, the first dielectric layer 264 may include aluminum oxide, zirconium oxide, zirconium aluminum oxide, hafnium oxide, other metal oxide, or a combination thereof. In one embodiment, the first dielectric layer 264 may be formed of hafnium oxide. The first dielectric layer 264 may be deposited using ALD. In some implementations, the first dielectric layer 264 may have a thickness between about 1.5 nm and about 4 nm.

Referring to FIGS. 1B and 17, method 100 includes a block 132 where a liner 266 is deposited over the first dielectric layer 264. In some embodiments, the liner 266 is formed of silicon oxide. The liner 266 may be deposited over the first dielectric layer 264 by ALD to a thickness between about 1.5 nm and about 4 nm to plug the space between adjacent channel members 2080. Due to the greater thickness of the bottom sacrificial layer 206B, the cavity 262 remains unfilled by the liner 266. The liner 266 allows selective deposition of a bottom anti-reflective coating (BARC) layer 268 into the cavity 262 at block 134.

Figure 18:
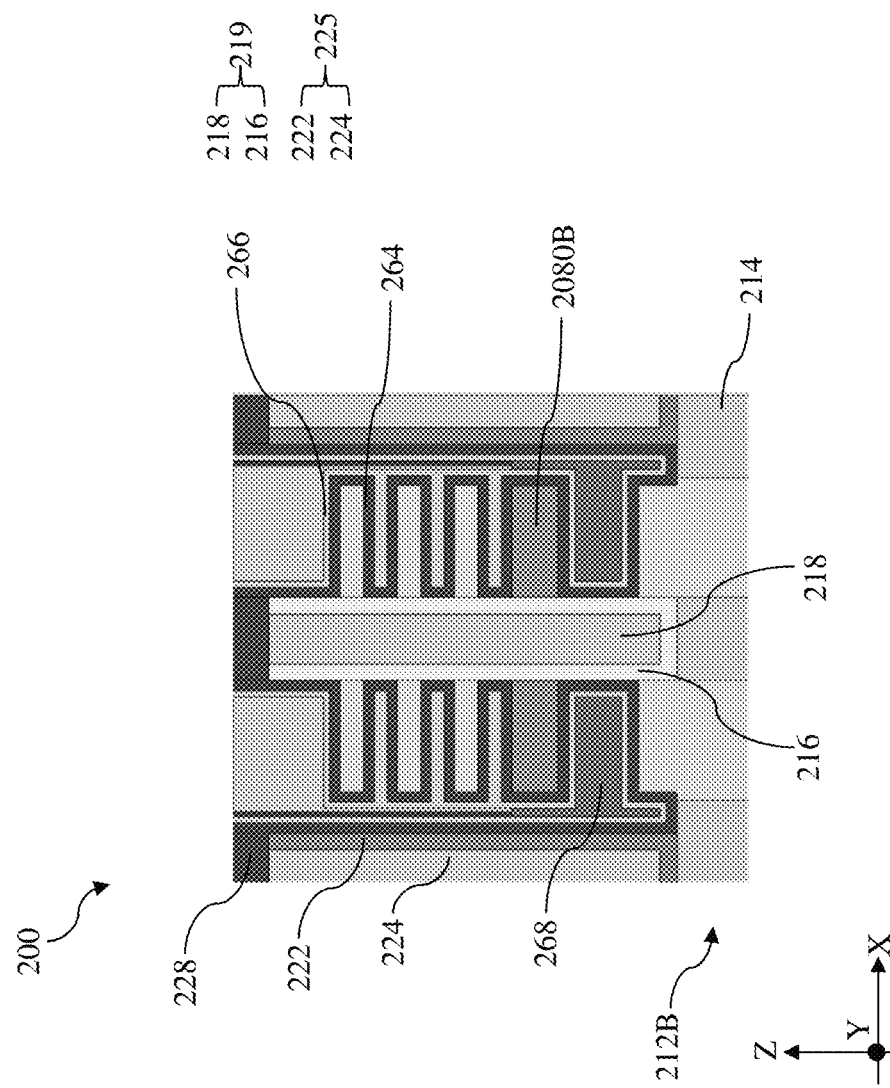

Referring to FIGS. 1B and 18, method 100 includes a block 134 where a bottom anti-reflective coating (BARC) layer 268 is deposited to fill in a cavity 262 below the APT member 2080B. In some embodiments, the BARC layer 268 may include polysulfones, polyureas, polyurea sulfones, polyacrylates, poly(vinyl pyridine), or a silicon-containing polymer. At block 134, the BARC layer 268 may be deposited over the workpiece 200 using spin-on coating or FCVD. The deposited BARC layer 268 is then etched back until no BARC layer 268 is above the APT member 2080B.

Figure 19:
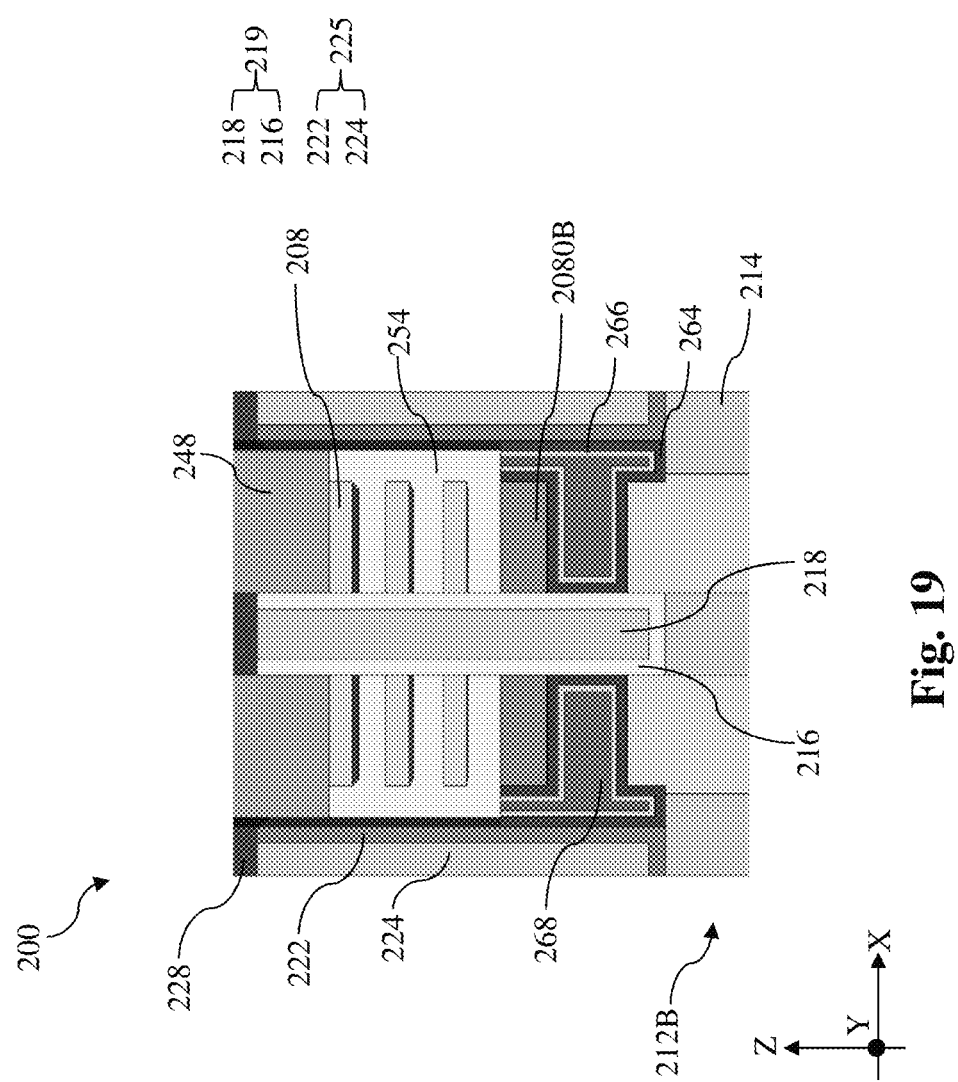

Referring to FIGS. 1B and 19, method 100 includes a block 136 where the liner 266 and the first dielectric layer 264 are etched back. With the BARC layer 268 protecting the underlying liner 266 and the first dielectric layer 264, the liner 266 and the first dielectric layer 264 above the APT member 2080B are etched back at block 136. In some embodiments, the etch back of the liner 266 and the first dielectric layer 264 is performed using a selective wet etch process or a selective dry etch process. An example selective wet etch process may include use of a high-temperature sulfuric peroxide mixture (SPM, also known as a piranha solution, including sulfuric acid ($H_2SO_4$) and hydrogen peroxide ($H_2O_2$)) or phosphoric acid ($H_3PO_4$). An example selective dry etch process may include use of boron trichloride ($BCl_3$).

Figure 20:
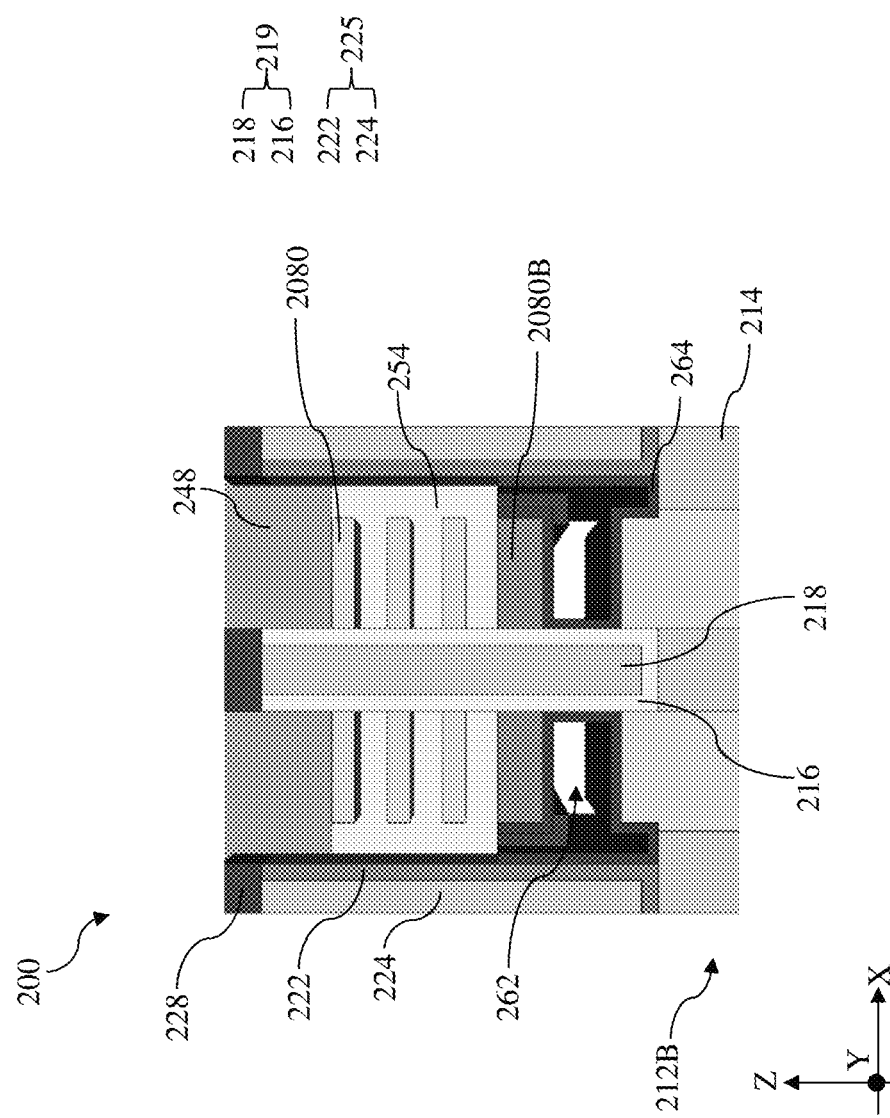

Referring to FIGS. 1B and 20, method 100 includes a block 138 where the BARC layer 268 and the remaining liner 266 are etched back. At block 138, the BARC layer 268 is first removed by ashing or stripping. After the removal of the BARC layer 268, the exposed liner 266 is selectively removed using a selective wet etch process, such as a wet etch process that uses buffered hydrofluoric acid (BHF) or diluted hydrofluoric acid (DHF). With the removal of the BARC layer 268 and the liner 266, the cavity 262 under the APT member 2080B once again becomes vacant, albeit lined by the first dielectric layer 264.

Figure 21:
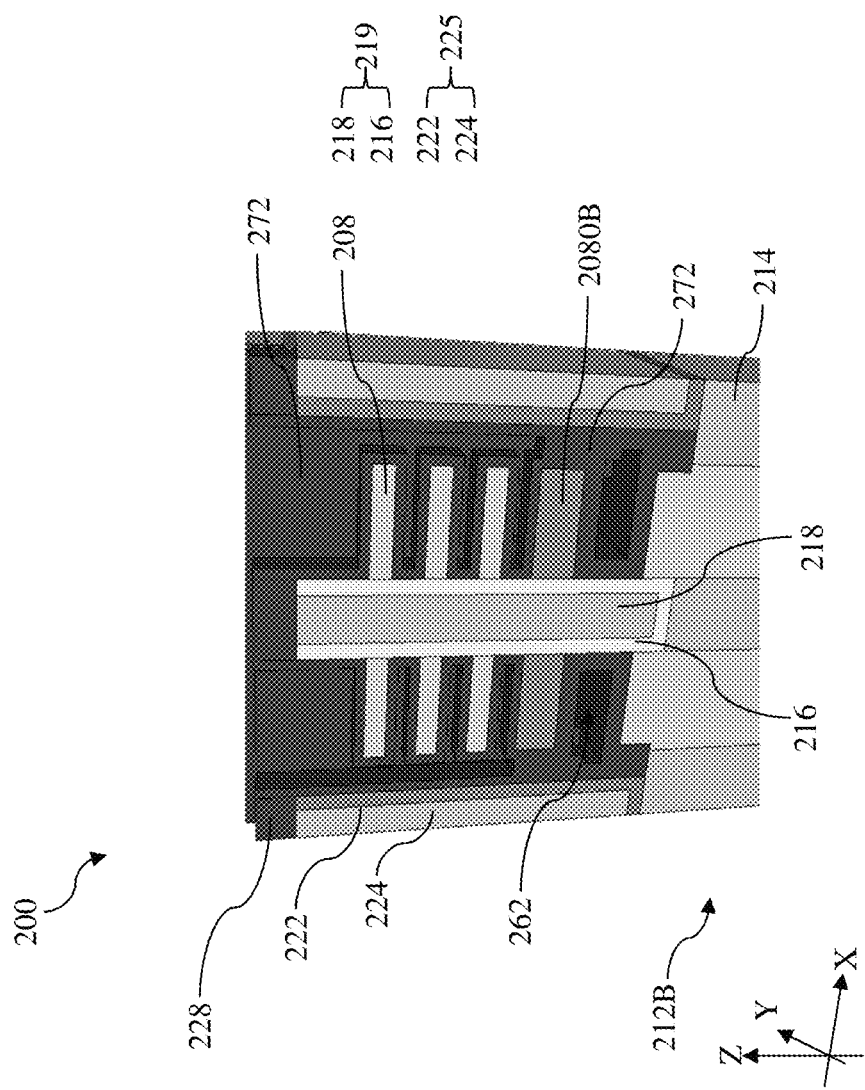

Referring to FIGS. 1B and 21, method 100 includes a block 140 where a second dielectric layer 272 is deposited to seal the cavity 262 below the APT member 2080B. In some embodiments, the second dielectric layer 272 is also formed of a high-k dielectric material, such as aluminum oxide, zirconium oxide, zirconium aluminum oxide, hafnium oxide, other metal oxide, or a combination thereof. In one embodiment, the second dielectric layer 272 may be formed of hafnium oxide. The second dielectric layer 272 may be deposited using CVD or ALD. In some implementations, the second dielectric layer 272 may be deposited to a thickness between about 2 nm and about 6 nm to seal the cavity 262, but not fill it up. In addition to sealing up the cavity 262, the second dielectric layer 272 is also conformally deposited over the helmet layer 228, the center dielectric fin 219, the separation dielectric fins 225, surfaces of the channel members 2080, and the exposed surfaces of the APT member 2080B. After the cavities 262 are sealed off by the second dielectric layer 272, each of them may have a height (along the Z direction) between about 3 nm and about 25 nm. The cavities 262 may also be referred to as gaps or capsules.

Figure 22:
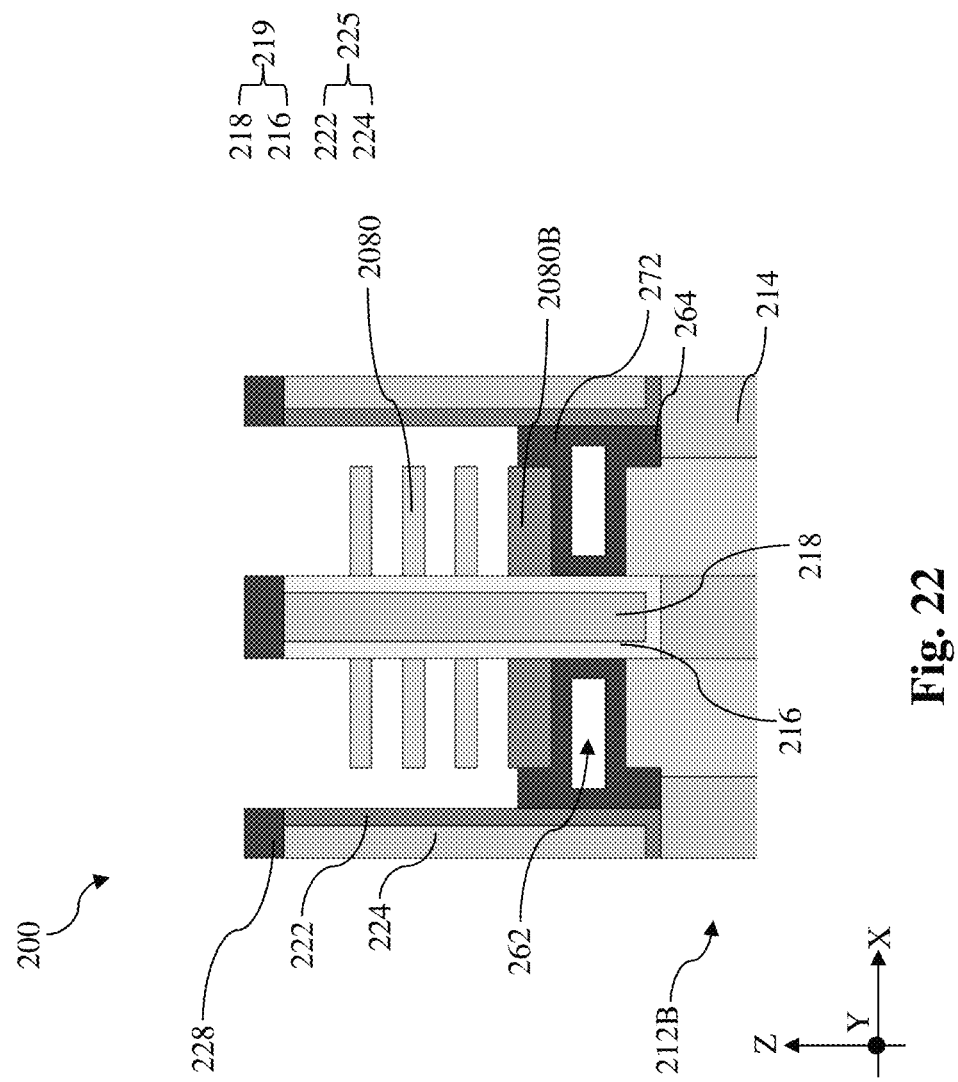

Referring to FIGS. 1B and 22, method 100 includes a block 142 where the deposited second dielectric layer 272 is etched back. At block 142, the second dielectric layer 272 that is above the APT member 2080B is selectively removed using a selective wet etch process or a selective dry etch process. An example selective wet etch process may include use of a high-temperature sulfuric peroxide mixture (SPM, also known as a piranha solution, including sulfuric acid ($H_2SO_4$) and hydrogen peroxide ($H_2O_2$)) or phosphoric acid ($H_3PO_4$). An example selective dry etch process may include use of boron trichloride ($BCl_3$). The selective removal prepares the channel members 2080 for the upcoming deposition of gate structures. As shown in FIG. 22, the first dielectric layer 264 and the second dielectric layer 272 surrounds and defines the cavity 262. Each of the cavities 262 is disposed between an APT member 2080B and a base portion 212B. Along the X direction, each of the cavities 262 is disposed between a separation dielectric fin 225 and a center dielectric fin 219.

Figure 23:
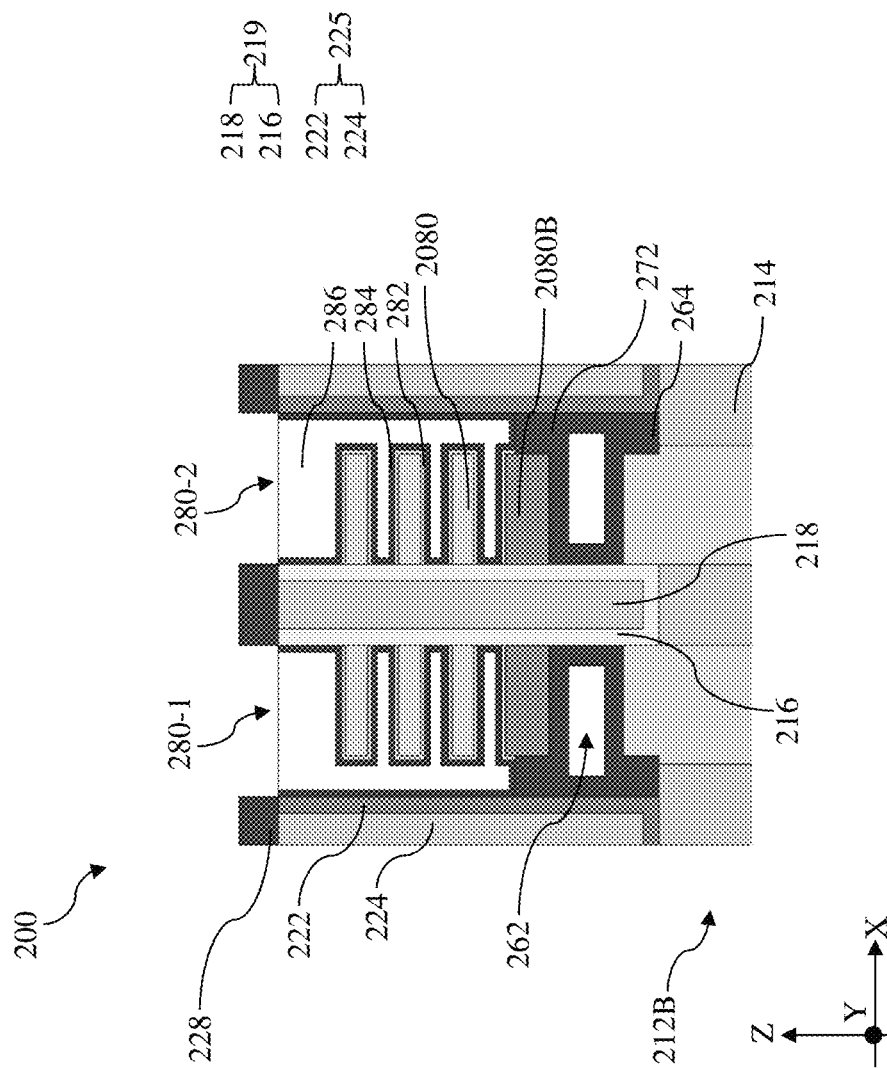

Referring to FIGS. 1B and 23, method 100 includes a block 144 where a first gate structure 280-1 and a second gate structure 280-2 are formed to wrap around each of the channel members 2080. Each of the first gate structure 280-1 and the second gate structure 280-2 includes an interfacial layer 282 on the channel members 2080 and the APT member 2080B, a gate dielectric layer 284 over the interfacial layer 282, and a gate electrode layer 286 over the gate dielectric layer 284. In some embodiments, the interfacial layer 282 includes silicon oxide and may be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel members 2080 and the APT member 2080B to form the interfacial layer 282. The gate dielectric layer 284 is then deposited over the interfacial layer 282 using ALD, CVD, and/or other suitable methods. The gate dielectric layer 284 may include high-K dielectric materials. In one embodiment, the gate dielectric layer 284 may include hafnium oxide. Alternatively, the gate dielectric layer 284 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HfTiO), $(Ba,Sr)TiO_3$ (BST), silicon nitride (SiN), silicon oxynitride (SiON), combinations thereof, or other suitable material.

After the formation or deposition of the interfacial layer 282 and the gate dielectric layer 284, the gate electrode layer 286 is deposited over the gate dielectric layer 284. The gate electrode layer 286 may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer 286 may be formed by ALD, PVD, CVD, e-beam evaporation, or other suitable process. Although not explicitly shown in the figures, the first gate structure 280-1 and the second gate structure 280-2 are deposited as a joint gate structure and then etched back until the helmet layer 228 separates the joint gate structure into the first gate structure 280-1 and the second gate structure 280-2. As shown in FIG. 23, each of the first gate structure 280-1 and the second gate structure 280-2 wraps around each of the channel members 2080 vertically stacked over a base portion 212B. It is noted that neither the first gate structure 280-1 nor the second gate structure 280-2 extends between the center dielectric fin 219 and the channel members 2080 as the channel members 2080 are in contact with the center dielectric fin 219.

Figure 24:
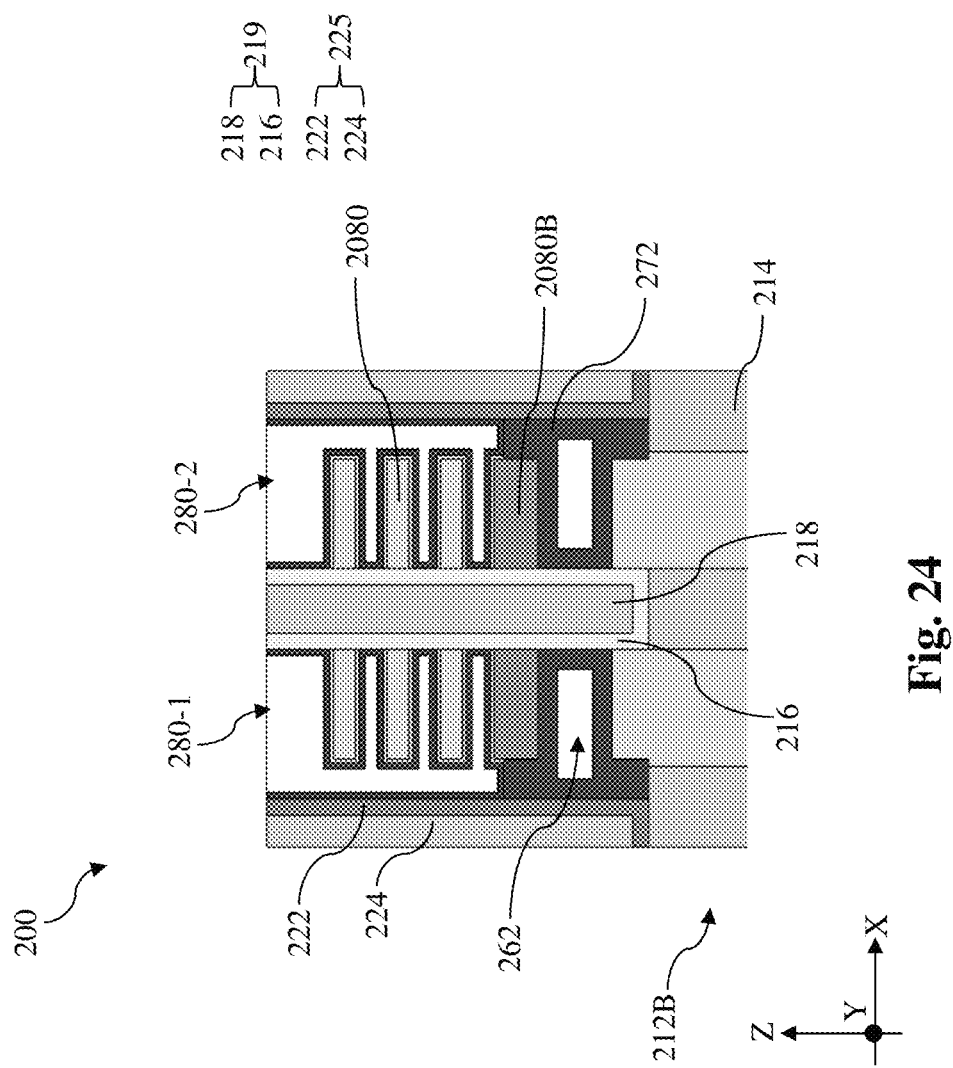

Referring to FIGS. 1B and 24, method 100 includes a block 146 where the helmet layer 228 is etched back. In some embodiments represented in FIG. 24, the helmet layer 228 may be selectively removed suing a selective dry etch process or a selective wet etch process. An example selective wet etch process may include use of a high-temperature sulfuric peroxide mixture (SPM, also known as a piranha solution, including sulfuric acid ($H_2SO_4$) and hydrogen peroxide ($H_2O_2$)) or phosphoric acid ($H_3PO_4$). An example selective dry etch process may include use of boron trichloride ($BCl_3$). The etch back at block 146 does not etch the first gate structure 280-1 and the second gate structure 280-2 substantially or etches them at a slower rate than it etches the helmet layer 228.

Figure 25:
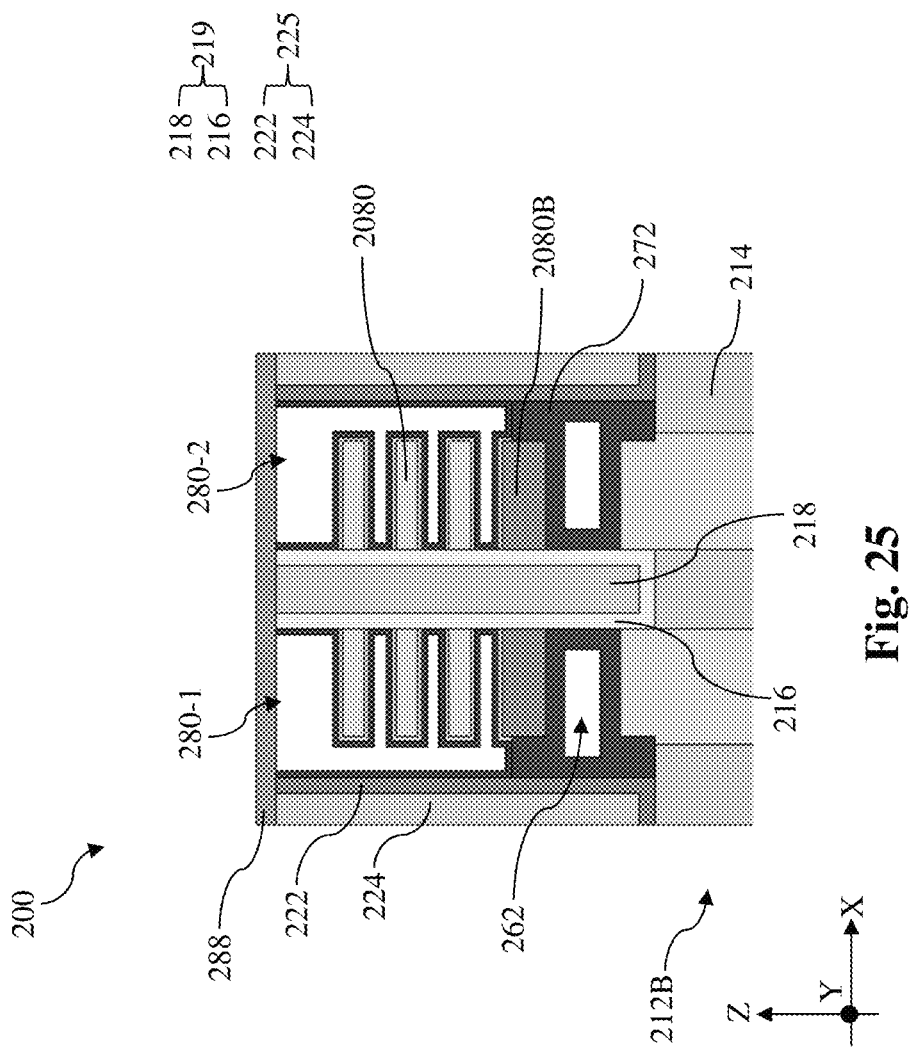

Referring to FIGS. 1B and 25, method 100 includes a block 148 where a metal cap layer 288 is deposited. After the removal of the helmet layer 228, the metal cap layer 288 is deposited over the first gate structure 280-1, the second gate structure 280-2, the center dielectric fin 219, and the separation dielectric fins 225. In some embodiments, the metal cap layer 288 may include titanium (Ti), titanium nitride (TiN), tantalum nitride (TaN), tungsten (W), ruthenium (Ru), cobalt (Co), or nickel (Ni) and may be deposited using PVD, CVD, or metal organic chemical vapor deposition (MOCVD). In one embodiment, the metal cap layer 288 includes tungsten (W) and is deposited by PVD. When not separated by a gate cut feature 292 (to be described below), the metal cap layer 288 electrically couples the first gate structure 280-1 and the second gate structure 280-2.

Figure 26:
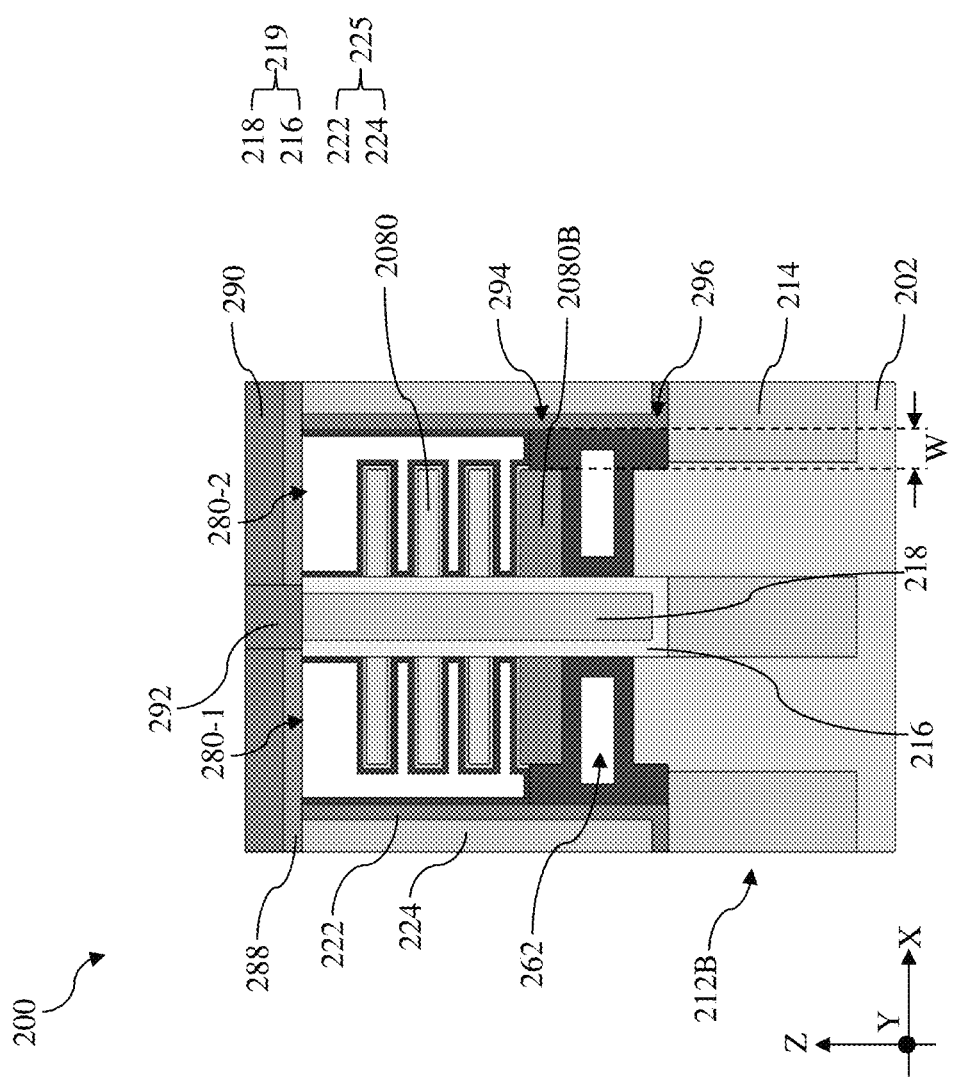

Referring to FIGS. 1B and 26, method 100 includes a block 150 where a self-aligned cap (SAC) layer 290 is formed over the gate structures. After the deposition of the metal cap layer 288, the SAC layer 290 is deposited over the workpiece 200 by CVD, PECVD, or a suitable deposition process. The SAC layer 290 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. Photolithography processes and etch processes are then performed to etch the deposited SAC layer 290 to form a gate cut opening to expose the top surfaces of the center dielectric fin 219.

Referring to FIGS. 1B and 26, method 100 includes a block 152 where a gate cut feature 292 is formed over the center dielectric fin. Thereafter, a dielectric material is deposited and planarized by a CMP process to form the gate cut features 292 in the gate cut opening over the center dielectric fin 219. The dielectric material for the gate cut features 292 may be deposited using HDPCVD, CVD, ALD, or a suitable deposition technique. In some instances, the gate cut feature 292 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. In some embodiments, the gate cut feature 292 and the SAC layer 290 may have different compositions to introduce etch selectivity. The portion of the first dielectric layer 264 and the second dielectric layer 272 that extends between the APT member 2080B and the separation dielectric fin 225 may be referred to as an end cap 294. As shown in FIG. 26, the end cap 294 may have a width W along the X direction. The width W may be between about 7 nm and about 18 nm. Additionally, another portion of the first dielectric layer 264 and the second dielectric layer 272 may extend between a base portion 212B and a separation dielectric fin 225 and may be referred to as base end cap 296. A width of the base end cap 296 may be similar to the end cap 294.

Figure 27:
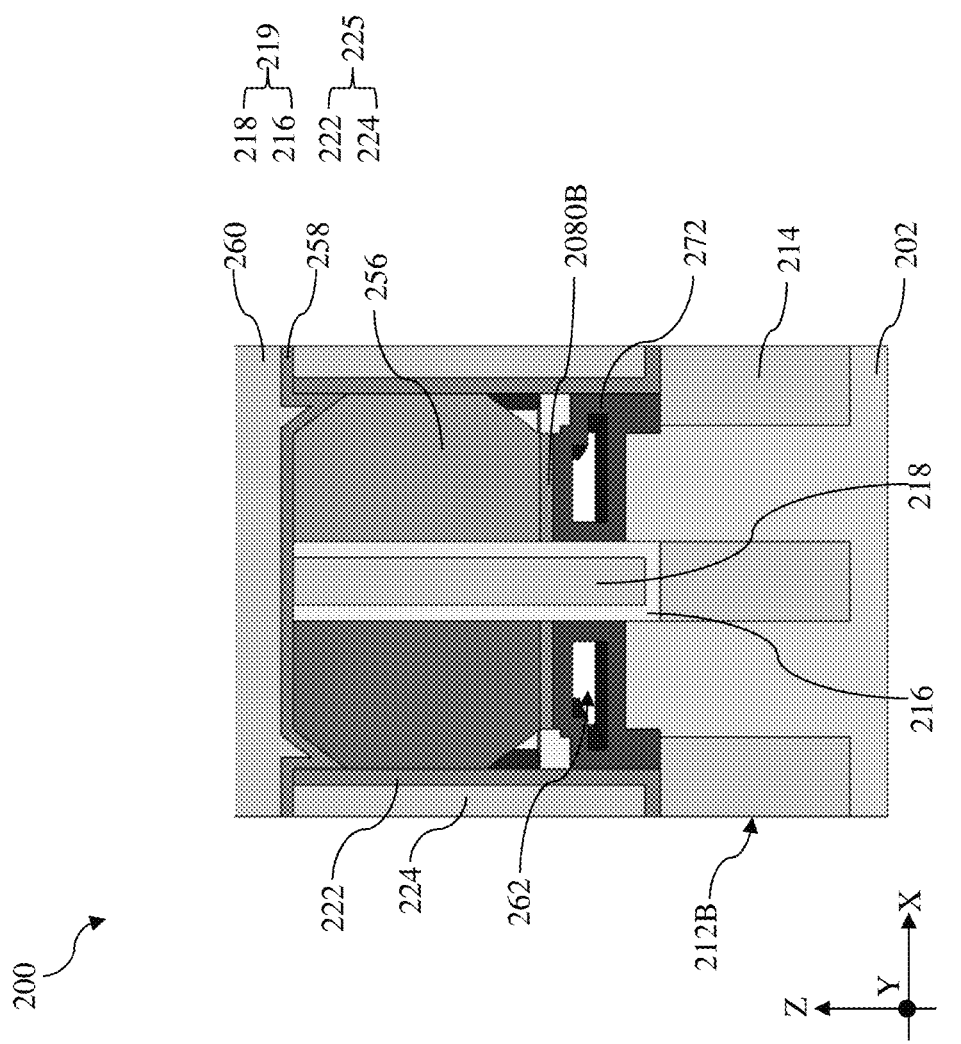

FIG. 27 illustrates a fragmentary cross-sectional view across source/drain regions of the workpiece 200 after operations at block 152 are concluded. In some embodiments, due to faceted growth of the source/drain features 256, a portion of the CESL 258 may extends downward into the space between a source/drain feature 256 and a separation dielectric fin 225. Due to the recess operations to form the source/drain recesses, the APT member 2080B in the source/drain region may be thinner than that in the channel regions under either the first gate structure 280-1 or the second gate structure 280-2, as shown in FIG. 26. Because the selective removal of the bottom sacrificial layer 206B and the cladding layer 220 takes place after the formation of the inner spacer features 254, a portion of the inner spacer feature 254 is disposed between the APT member 2080B and the separation dielectric fin 225. That is, in the source/drain region, the APT member 2080B does not engage any end caps that are formed of the first dielectric layer 264 or the second dielectric layer 272.

Reference is made to FIGS. 26 and 27. Upon conclusion of method 100, two MBC transistors that are divided by the center dielectric fin 219 are formed. One of them is controlled by the first gate structure 280-1 and the other is controlled by the second gate structure 280-2. In some embodiments, these two MBC transistors are of the same conductivity type or of different conductivity types. For example, both MBC transistors may be p-type with p-type source/drain features 256 and n-type APT members 2080B. For another example, both MBC transistors may be n-type with n-type source/drain features 256 and p-type APT members 2080B. Because the channel members 2080 are in contact with and stem from sidewalls of the center dielectric fin 219, the MBC transistors may be referred to as fort-sheet transistors or fish-bone transistors. Alternatively, these MBC transistors may be referred to as MBC transistors with fish-bone/fork-sheet structures.

Based on the above discussions, it can be seen that the present disclosure offers advantages. It is understood, however, that other embodiments may offer additional advantages, and not all advantages are necessarily disclosed herein, and that no particular advantage is required for all embodiments. For example, the present disclosure provides fork-sheet transistors where channel members on either side of a center dielectric fin are disposed over an anti-punch-through (APT) member that stems from the center dielectric fin. A cavity or capsule below the APT member further isolate the channel members from base portions that are connected to the bulk substrate. The APT members and the cavities below the APT members may reduce leakage through the bulk substrate.

In one aspect, the present disclosure provides embodiments of a semiconductor structure that includes a first base portion and a second base portion, an isolation feature sandwiched between the first base portion and the second base portion, a center dielectric fin over the isolation feature, a first anti-punch-through (APT) feature over the first base portion, a second APT feature over the second base portion, a first stack of channel members over the first APT feature, and a second stack of channel members over the second APT feature. The center dielectric fin is sandwiched between the first stack of channel members and the second stack of channel members as well as between the first APT feature and the second APT feature.

In some embodiments, the first stack of channel members are in contact with a source/drain feature and the source/drain feature and first APT feature are doped with different types of dopants. In some implementations, the semiconductor structure may further include a first cavity disposed between the first base portion and the first APT feature and a second cavity disposed between the second base portion and the second APT feature. The center dielectric fin extends between the first cavity and the second cavity. In some instances, the first cavity is defined in at least one dielectric layer. In some embodiments, the at least one dielectric layer includes aluminum oxide, zirconium oxide, zirconium aluminum oxide, hafnium oxide, or a combination thereof. In some embodiments, the semiconductor structure may further include a first gate structure wrapping around each of the first stack of channel members and a second gate structure wrapping around each of the second stack of channel members. The first gate structure does not extend between the first APT feature and the first base portion and the second gate structure does not extend between the second APT feature and the second base portion. In some instances, the first gate structure is sandwiched between the center dielectric fin and a separation dielectric fin. In some embodiments, the first APT feature is in contact with the center dielectric fin and spaced apart from the separation dielectric fin by the at least one dielectric layer. In some implementations, a portion of the at least one dielectric layer extends between the separation dielectric fin and the first base portion.

In another aspect, the present disclosure provides embodiments of a semiconductor structure that includes a first base portion and a second base portion, an isolation feature sandwiched between the first base portion and the second base portion, a center dielectric fin over the isolation feature, a first anti-punch-through (APT) feature over the first base portion, a second APT feature over the second base portion, a first source/drain feature over the first APT feature, and a second source/drain feature over the second APT feature. The center dielectric fin is sandwiched between the first source/drain feature and the second source/drain feature as well as between the first APT feature and the second APT feature.

In some embodiments, the first source/drain feature and the second source/drain feature are doped with a dopant of a first conductivity type and the first APT feature and the second APT feature are doped with a dopant of a second conductivity type different from the first conductivity type. In some implementations, the semiconductor structure may further include a first cavity disposed between the first base portion and the first APT feature and a second cavity disposed between the second base portion and the second APT feature. The center dielectric fin extends between the first cavity and the second cavity. In some embodiments, the first cavity is defined in at least one dielectric layer. In some embodiments, the at least one dielectric layer includes aluminum oxide, zirconium oxide, zirconium aluminum oxide, hafnium oxide, or a combination thereof. In some instances, the first source/drain feature is sandwiched between the center dielectric fin and a separation dielectric fin. In some instances, the first APT feature is in contact with the center dielectric fin and spaced apart from the separation dielectric fin by an inner spacer feature. In some implementations, a portion of the at least one dielectric layer extends between the separation dielectric fin and the first base portion.

In yet another aspect, the present disclosure provides embodiments of a method that includes depositing a bottom sacrificial layer over a substrate, depositing a doped silicon layer over the bottom sacrificial layer, forming a stack over the doped silicon layer, the stack including a plurality of channel layers interleaved by a plurality of sacrificial layers, depositing a top sacrificial layer over the stack, patterning the top sacrificial layer, the stack, the doped silicon layer, the bottom sacrificial layer, and a portion of the substrate to form a first fin-shaped structure and a second fin-shaped structure, forming a center dielectric fin between the first fin-shaped structure and the second fin-shaped structure, forming a helmet layer on the center dielectric fin, and selectively removing the top sacrificial layer from the first fin-shaped structure and the second fin-shaped structure.

In some embodiments, the method may further include forming a dummy gate stack over channel regions of the first fin-shaped structure and the second fin-shaped structure, recessing source/drain regions of the first fin-shaped structure and the second fin-shaped structure, selectively recessing the plurality of sacrificial layers to form inner spacer features, forming a first source/drain feature in contact with the doped silicon layer, removing the dummy gate stack, selectively removing the sacrificial layers and the bottom sacrificial layer in the first fin-shaped structure and the second fin-shaped structure to release the plurality of channel layers as channel members and the doped silicon layer as an anti-punch-through (APT) feature, conformally depositing a first high-k dielectric layer over surfaces of the channel members and the APT feature, and conformally depositing an oxide liner over the first high-k dielectric layer. In some implementations, the method may further include depositing a bottom anti-reflective coating (BARC) layer over the oxide liner, after the depositing of the BARC layer, etching back the BARC until a top surface of the BARC layer is between a top surface of the APT feature, etching back the oxide liner and the first high-k dielectric layer, after the etching back of the oxide liner and the first high-k dielectric layer, selectively removing BARC layer to form a cavity below the APT feature, sealing the cavity with a second high-k dielectric layer, and after the sealing, forming a gate structure to wrap around each of the channel members.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first base portion and a second base portion;
an isolation feature sandwiched between the first base portion and the second base portion;
a center dielectric fin over the isolation feature;
a first anti-punch-through (APT) feature over the first base portion;
a second APT feature over the second base portion;
a first cavity disposed between the first base portion and the first APT feature;
a second cavity disposed between the second base portion and the second APT feature;
a first stack of channel members over the first APT feature; and
a second stack of channel members over the second APT feature,
wherein the center dielectric fin is sandwiched between the first stack of channel members and the second stack of channel members as well as between the first APT feature and the second APT feature.

2. The semiconductor structure of claim 1,
wherein the first stack of channel members are in contact with a source/drain feature, and
wherein the source/drain feature and first APT feature are doped with different types of dopants.

3. The semiconductor structure of claim 1,
wherein the center dielectric fin extends between the first cavity and the second cavity.

4. The semiconductor structure of claim 1, wherein the first cavity is defined in at least one dielectric layer.

5. The semiconductor structure of claim 4, wherein the at least one dielectric layer comprises aluminum oxide, zirconium oxide, zirconium aluminum oxide, hafnium oxide, or a combination thereof.

6. The semiconductor structure of claim 4, further comprising:
a first gate structure wrapping around each of the first stack of channel members; and
a second gate structure wrapping around each of the second stack of channel members,
wherein the first gate structure does not extend between the first APT feature and the first base portion, and
wherein the second gate structure does not extend between the second APT feature and the second base portion.

7. The semiconductor structure of claim 6, wherein the first gate structure is sandwiched between the center dielectric fin and a separation dielectric fin.

8. The semiconductor structure of claim 7, wherein the first APT feature is in contact with the center dielectric fin and spaced apart from the separation dielectric fin by the at least one dielectric layer.

9. The semiconductor structure of claim 7, wherein a portion of the at least one dielectric layer extends between the separation dielectric fin and the first base portion.

10. A semiconductor structure, comprising:
a first base portion and a second base portion;
an isolation feature sandwiched between the first base portion and the second base portion;
a center dielectric fin over the isolation feature;
a first anti-punch-through (APT) feature over and spaced apart from the first base portion;
a second APT feature over and spaced apart from the second base portion;
a first source/drain feature over the first APT feature; and
a second source/drain feature over the second APT feature,
wherein the center dielectric fin is sandwiched between the first source/drain feature and the second source/drain feature as well as between the first APT feature and the second APT feature.

11. The semiconductor structure of claim 10,
wherein the first source/drain feature and the second source/drain feature are doped with a dopant of a first conductivity type, and wherein the first APT feature and the second APT feature are doped with a dopant of a second conductivity type different from the first conductivity type.

12. The semiconductor structure of claim 10, further comprising:
a first cavity disposed between the first base portion and the first APT feature; and
a second cavity disposed between the second base portion and the second APT feature,
wherein the center dielectric fin extends between the first cavity and the second cavity.

13. The semiconductor structure of claim 12, wherein the first cavity is defined in at least one dielectric layer.

14. The semiconductor structure of claim 13, wherein the at least one dielectric layer comprises aluminum oxide, zirconium oxide, zirconium aluminum oxide, hafnium oxide, or a combination thereof.

15. The semiconductor structure of claim 13, wherein the first source/drain feature is sandwiched between the center dielectric fin and a separation dielectric fin.

16. The semiconductor structure of claim 15, wherein the first APT feature is in contact with the center dielectric fin and spaced apart from the separation dielectric fin by an inner spacer feature.

17. The semiconductor structure of claim 15, wherein a portion of the at least one dielectric layer extends between the separation dielectric fin and the first base portion.

18. A method, comprising:
depositing a bottom sacrificial layer over a substrate;
depositing a doped silicon layer over the bottom sacrificial layer;
forming a stack over the doped silicon layer, the stack comprising a plurality of channel layers interleaved by a plurality of sacrificial layers;
depositing a top sacrificial layer over the stack;
patterning the top sacrificial layer, the stack, the doped silicon layer, the bottom sacrificial layer, and a portion of the substrate to form a first fin-shaped structure and a second fin-shaped structure;
forming a center dielectric fin between the first fin-shaped structure and the second fin-shaped structure;
forming a helmet layer on the center dielectric fin; and
selectively removing the top sacrificial layer from the first fin-shaped structure and the second fin-shaped structure.

19. The method of claim 18, further comprising:
forming a dummy gate stack over channel regions of the first fin-shaped structure and the second fin-shaped structure;
recessing source/drain regions of the first fin-shaped structure and the second fin-shaped structure;
selectively recessing the plurality of sacrificial layers to form inner spacer features;
forming a first source/drain feature in contact with the doped silicon layer;
removing the dummy gate stack;
selectively removing the sacrificial layers and the bottom sacrificial layer in the first fin-shaped structure and the second fin-shaped structure to release the plurality of channel layers as channel members and the doped silicon layer as an anti-punch-through (APT) feature;
conformally depositing a first high-k dielectric layer over surfaces of the channel members and the APT feature; and
conformally depositing an oxide liner over the first high-k dielectric layer.

20. The method of claim 19, further comprising:
depositing a bottom anti-reflective coating (BARC) layer over the oxide liner;
after the depositing of the BARC layer, etching back the BARC until a top surface of the BARC layer is between a top surface of the APT feature;
etching back the oxide liner and the first high-k dielectric layer;
after the etching back of the oxide liner and the first high-k dielectric layer, selectively removing BARC layer to form a cavity below the APT feature;
sealing the cavity with a second high-k dielectric layer; and
after the sealing, forming a gate structure to wrap around each of the channel members.

* * * * *